(12) United States Patent
Lin et al.

(10) Patent No.: US 12,520,500 B2
(45) Date of Patent: Jan. 6, 2026

(54) MEMORY DEVICE AND METHOD FOR FORMING THEREOF

(71) Applicant: TAIWAN SEMICONDUCTOR MANUFACTURING COMPANY LTD., Hsinchu (TW)

(72) Inventors: Han-Ting Lin, Hsinchu (TW); Jiann-Horng Lin, Hsinchu (TW); Hsing-Hsiang Wang, Hsinchu (TW); Huan-Just Lin, Hsinchu (TW); Sin-Yi Yang, Taichung (TW); Chen-Jung Wang, Hsinchu (TW); Kun-Yi Li, Hsinchu (TW); Meng-Chieh Wen, Kaohsiung (TW); Lan-Hsin Chiang, Hsinchu (TW); Lin-Ting Lin, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 384 days.

(21) Appl. No.: 17/184,211

(22) Filed: Feb. 24, 2021

(65) Prior Publication Data

US 2022/0271087 A1    Aug. 25, 2022

(51) Int. Cl.
| | |
|---|---|
| *H01L 23/544* | (2006.01) |
| *H10B 61/00* | (2023.01) |
| *H10N 50/01* | (2023.01) |
| *H10N 50/10* | (2023.01) |
| *H10N 50/80* | (2023.01) |
| *H10N 50/85* | (2023.01) |

(52) U.S. Cl.
CPC .............. *H10B 61/20* (2023.02); *H10N 50/01* (2023.02); *H10N 50/10* (2023.02); *H10N 50/80* (2023.02); *H10N 50/85* (2023.02)

(58) Field of Classification Search
CPC ....... H10N 50/10; H10B 61/00; H01L 23/544
See application file for complete search history.

(56) References Cited

U.S. PATENT DOCUMENTS

| | | | | |
|---|---|---|---|---|
| 6,599,809 | B2* | 7/2003 | Anma | H01L 21/7684 |
| | | | | 257/E21.546 |
| 10,770,653 | B1* | 9/2020 | Penny | H10B 61/00 |
| 2006/0141737 | A1* | 6/2006 | Gaidis | H01L 23/544 |
| | | | | 257/E27.005 |
| 2019/0371996 | A1 | 12/2019 | Chuang | H10B 61/22 |
| 2020/0051922 | A1* | 2/2020 | Wang | H01L 23/544 |
| 2021/0167282 | A1* | 6/2021 | Wang | H01L 23/544 |
| 2021/0242396 | A1* | 8/2021 | Kim | H10B 61/00 |
| 2021/0249357 | A1* | 8/2021 | Li | H10N 50/01 |
| 2022/0052253 | A1* | 2/2022 | Kuo | H10N 50/01 |
| 2022/0085284 | A1* | 3/2022 | Liu | H10N 50/10 |
| 2022/0115584 | A1* | 4/2022 | Wang | H10N 50/01 |

* cited by examiner

*Primary Examiner* — Eric K Ashbahian
(74) *Attorney, Agent, or Firm* — WPAT LAW; Anthony King

(57) ABSTRACT

A semiconductor structure and a method for forming a semiconductor structure are provided. A substrate having a cell region and a mark region is received. A dielectric layer is etched to expose a conductive line in the cell region and form a trench in the mark region. A conductive layer is formed over the cell region and in the trench. The conductive layer is etched to form a bottom electrode via in the cell region and a first mark layer in the trench.

20 Claims, 17 Drawing Sheets

MEMORY DEVICE AND METHOD FOR FORMING THEREOF

BACKGROUND

Electronic equipment involving semiconductor devices is essential for many modern applications. Technological advances in materials and design have produced generations of semiconductor devices, in which each generation includes smaller and more complex circuits than the previous generation. The semiconductor integrated circuit (IC) industry has produced a wide variety of digital devices to address issues in a number of different areas. Some of these digital devices, such as memory arrays, are configured for the storage of data. However, with the continuous shrinking of memory devices, fabrication processes continue to become more difficult to perform and new challenges are being discovered.

BRIEF DESCRIPTION OF THE DRAWINGS

Aspects of the embodiments of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
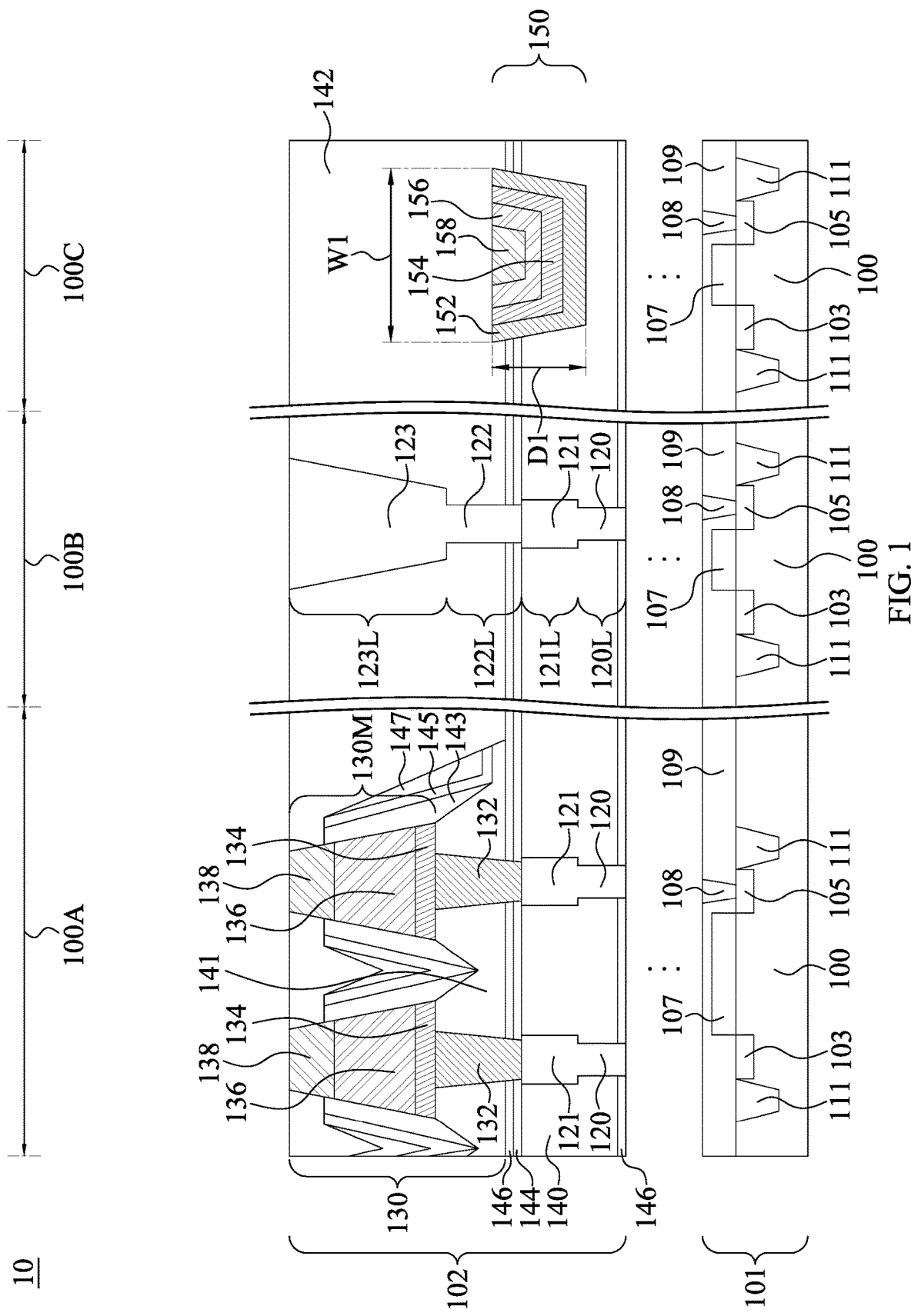
FIG. 1 is a cross section of a semiconductor structure, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation.

A semiconductor memory, such as a magnetoresistive random access memory (MRAM), may include an array of densely-packed MRAM cells. In each MRAM cell, a data-storage element, such as a magnetic tunneling junction (MTJ) element, may be integrated with a transistor to perform write and read operations. The MTJ element includes a reference layer and a free layer separated by a tunnel barrier layer (TBL). The reference layer has a fixed magnetization direction, while the free layer has a variable magnetization direction. If the magnetization directions of the reference layer and the free layer are in a parallel orientation (a parallel state), it is easier for conduction electrons to tunnel through the TBL, such that the MTJ element is in a low-resistance state. Conversely, if the magnetization directions of the reference layer and the free layer are in an antiparallel orientation (an antiparallel state), it is more difficult for conduction electrons to tunnel through the TBL, such that the MTJ element is in a high-resistance state.

The MTJ element may be fabricated by patterning a MTJ layer stack disposed between a bottom electrode and a top electrode with photolithography. With the continuous shrinking of the memory devices, the patterning of the MTJ layer stack becomes difficult. The patterning of the MTJ layer stack requires topographic features for alignment and overlay marks on the MTJ layer stack. Alignment and overlay marks are usually formed by using an additional lithography process to generate marks. However, forming alignment and overlay marks in this manner requires additional lithography and cleaning processes, and thus increases processing cost. Also, the cleaning processes on a bottom electrode layer may damage the surface of the bottom electrode layer, such as increasing surface roughness of a bottom electrode of the MRAM cell. The deposition quality of the MTJ layer stack becomes worse due to the uneven surface of the bottom electrode. Therefore, it may be desirable to have a memory device and a method to address the above issues.

According to some embodiments of this disclosure, a semiconductor circuit with embedded MRAM cells defines a cell region and a logic region separated from the cell region. A transistor can be disposed under the MRAM cell.

In some embodiments, an MRAM cell is embedded in the metallization layer, or interconnect layer, prepared in a back-end-of-line (BEOL) operation. Transistors in the cell region and in the logic region may be disposed in a common semiconductor substrate, prepared in a front-end-of-line (FEOL) operation, and are substantially identical in the aforesaid two regions in some embodiments. The MRAM cell can be embedded in any position of the metallization layer, for example, between adjacent metal line layers distributed horizontally parallel to a surface of the semiconductor substrate. For instance, the MRAM cell can be located between the 4th metal line layer and the 5th metal line layer in a cell region. Horizontally shifted to the logic region, the metal line in the 4th metal line layer is connected to the metal line in the 5th metal line layer though a metal via in a 4th metal via layer between the 4th and 5th metal line layers. In other words, taking the cell region and the logic region into consideration, the MRAM cell occupies a thickness of at least a portion of the 5th metal line layer. Throughout the present disclosure, the term "metal line layer" refers to the collection of the metal lines in the same Nth metal line layer, where N is an integer greater than or equal to 1. Similarly, throughout the present disclosure, the term "metal via layer" refers to the collection of the metal vias in the same Nth metal via layer, where N is an integer greater than or equal to 1. In general, the MRAM cell is located between an Nth metal line layer and an (N+1)th metal line layer. Those skilled in the art can understand that the numbers provided for the metal line layers and the arrangement of the MRAM cell in the metallization layer described herein are not limiting.

The embedded MRAM cell includes the MTJ element composed of ferromagnetic materials. A bottom electrode and a top electrode are electrically coupled to the MTJ element for signal/bias conveyance. Following the example previously provided, the bottom electrode is further connected to the Nth metal line layer, whereas the top electrode is further connected to the (N+1)th metal line layer.

FIG. 1 is a cross section of a semiconductor structure 10, in accordance with some embodiments of the present disclosure. The semiconductor structure 10 can include a substrate 100 having a cell region 100A where memory devices are to be formed, a logic region 100E where logic circuits are to be formed and a mark region 100C where an alignment or overlay mark is to be formed. In some embodiments, the substrate 100 further includes a peripheral region (not shown) between the cell region 100A and the logic region 100B, or between the logic region 100B and the mark region 100C. In some embodiments, the cell region 100A may be located at the center of the substrate 100 while the logic region 100B may be located at a periphery of the substrate 100. In some embodiments, the cell region 100A and the logic region 100B may be located at the center of the substrate 100 while the mark region 100C may be located at a periphery of the substrate 100. Note the previous statement is not intended to be limiting. Other arrangements regarding the cell region 100A, the logic region 100B, the mark region 100C, and the peripheral region are enclosed in the contemplated scope of the present disclosure.

Figure 2:
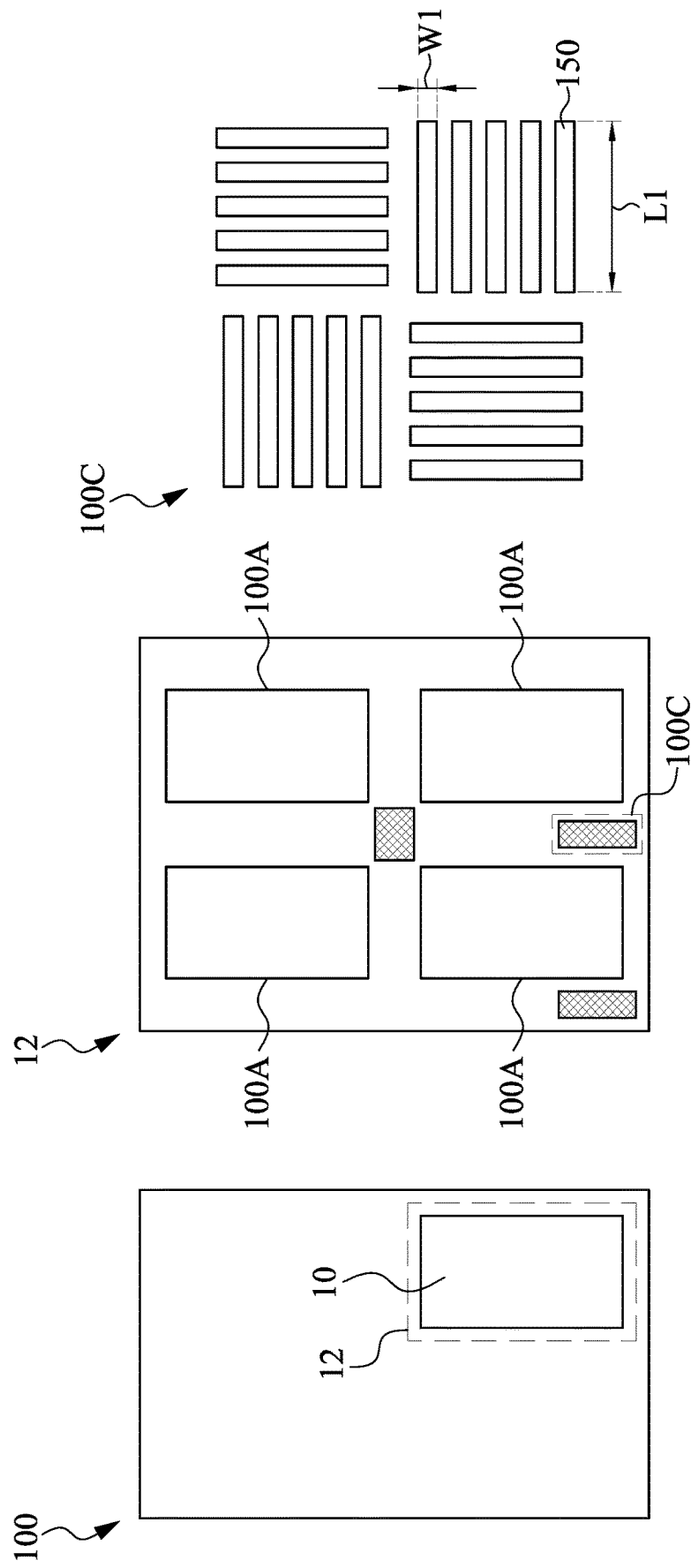
FIG. 2A is a top view of a substrate, in accordance with some embodiments of the present disclosure.
FIG. 2B is a zoomed-in top view of a chip area in FIG. 2A, in accordance with some embodiments of the present disclosure.
FIG. 2C is a zoomed-in top view of the mark region in FIG. 2B, in accordance with some embodiments of the present disclosure.

FIG. 2A is a top view of the substrate 100, in accordance with some embodiments of the present disclosure. As depicted in FIG. 2A, the semiconductor structure 10 is formed within a chip area 12 of the substrate 100. A plurality of semiconductor chip areas may be defined on the substrate 100 by scribe lines (not shown) between the chip areas. The substrate 100 may undergo a sequence of steps, e.g., cleaning, layering, patterning, etching and doping, to form the memory devices, the logic circuits and the alignment or overlay marks.

FIG. 2B is a zoomed-in top view of a chip area 12 in FIG. 2A, in accordance with some embodiments of the present disclosure. As depicted in FIG. 2B, one or more cell regions 100A is formed within the chip area 12. In some embodiments, one or more mark regions 100C is formed within the chip area 12. The mark region 100C may be located near but be separated from the cell region 100A. In some embodiments, the mark region 100C is between two adjacent cell regions 100A. In some embodiments, the mark regions 100C may have different sizes.

Referring to FIG. 2C, FIG. 2C is a zoomed-in top view of the mark region 100C in FIG. 2B, in accordance with some embodiments of the present disclosure. As depicted in FIG. 2C, the mark region 100C may include line-shaped features 150. The line-shaped features 150 may serve as alignment marks used in mask alignment in the subsequent lithography processes. A lithographic mask in an exposure tool may be aligned with the alignment mark 150 (e.g., the line-shaped features).

Referring back to FIG. 1, each of the cell region 100A and the logic region 100B has a transistor structure 101 in the substrate 100 and a metallization structure 102 arranged over the substrate 100. In some embodiments, the mark region 100C also has a transistor structure 101 in the substrate 100 and a metallization structure 102 arranged over the substrate 100.

In some embodiments, the substrate 100 is a silicon substrate, but the present disclosure is not limited thereto. In an embodiment, the substrate 100 is provided or formed which includes semiconductor materials, such as a silicon substrate, although it may include other semiconductor materials, such as silicon germanium, silicon carbide, gallium arsenide, or the like. In the present embodiment, the substrate 100 is a p-type semiconductor substrate (P-Substrate) or an n-type semiconductor substrate (N-Substrate) comprised of silicon. Alternatively, the substrate 100 includes another elementary semiconductor, such as germanium; a compound semiconductor including silicon carbide, gallium arsenic, gallium phosphide, indium phosphide, indium arsenide, and/or indium antimonids; an alloy semiconductor including SiGe, GaAsP, AlGaAs, GaInAs, GaInP, and/or GaInAsP, or combinations thereof. In yet another alternative, the substrate 100 is a semiconductor on insulator (SOI). In other alternatives, substrate 100 may include a doped epi layer, a gradient semiconductor layer, and/or a semiconductor layer overlying another semiconductor layer of a different type, such as a silicon layer on a silicon germanium layer. The substrate 100 may or may not include doped regions, such as a P-well, an N-well, or combination thereof.

In some embodiments, a shallow trench isolation (STI) 111 is provided in the substrate 100. The STI 111 may be provided to electrically isolate a transistor structure from neighboring semiconductor devices, such as other transistor structures. The STI 111 may be formed of suitable dielectric materials, include an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silica oxynitride ($Si_xO_yN_z$), and the like. The STI 111 may also be formed of any suitable "high dielectric constant" or "high K" material, where is greater than or equal to about 8, such as titanium oxide ($Ti_xO_y$, e.g., $TiO_2$), tantalum oxide ($Ta_xO_y$, e.g., $Ta_2O_5$), barium strontium titanate (BST, $BaTiO_3/SrTiO_3$), and the like. Alternatively, the STI 111 may also be formed of any suitable "low dielectric constant" or "low K" dielectric material, where K is less than or equal to about 4.

In some embodiments, the transistor structure 101 includes a gate region 107, a source region 103 and a drain region 105. The source region 103 and the drain region 105 are disposed at least partially in the substrate 100. In some embodiments, the gate region 107 can be a polysilicon gate or a metal gate. The gate region 107 is disposed over a top surface of the substrate 100 and between the source region 103 and the drain region 105. In some embodiments, the transistor structures 101 have similar configurations in the cell region 100A, the logic region 100B and the mark region 100C. In addition, only planar-type transistor structures 101 are show in FIG. 1A for illustrative purposes. However, the present disclosure is not limited thereto. Any non-planar transistor structures, such as a fin-type (FinFET) transistor structure, a gate-all-around transistor, a nanosheet transistor, a nanowire transistor, or the like, are within the contemplated scope of the present disclosure.

The semiconductor structure 10 may further include a contact plug 108 arranged in an inter-layer dielectric (ILD) 109, in which the contact plug 108 may be electrically coupled to the gate region 107 of the transistor structure 101. In some embodiments, the ILD 109 is formed over the substrate 100. A variety of techniques may be used for forming the ILD 109, e.g., chemical vapor deposition (CVD), low-pressure CVD (LPCVD), plasma-enhanced CVD (PECVD), sputtering and physical vapor deposition (PVD), thermal growing, and the like. The ILD 109 above the substrate 100 may be formed from a variety of dielectric materials and may, for example, be an oxide (e.g., Ge oxide), an oxynitride (e.g., GaP oxynitride), silicon dioxide ($SiO_2$), a nitrogen-bearing oxide (e.g., nitrogen-bearing $SiO_2$), a nitrogen-doped oxide (e.g., $N_2$-implanted $SiO_2$), silicon oxynitride (SixOyNz), and the like.

The metallization structure 102 is disposed above the transistor structure 101. Referring to the logic region 100B, the metallization structure 102 includes a plurality of metal line layers, e.g., an Nth metal line layer 121L and an (N+1)th metal line layer 123L, and an Nth metal via layer 122L and an (N−1)th metal via layer 120L. Metal lines 121 and 123 in the respective metal line layers 121L and 123L are interconnected through a metal via 122 in the Nth metal via layer 122L. The metal line 123 in the metal line layer 123L is electrically connected to overlying features through a metal via in an (N+1)th metal via layer. The metal line 121 in the metal line layer 121L is electrically connected to underlying features through a metal via 120 in the (N−1)th metal via layer 120L. The metal lines 121 and 123 and the metal vias 120 and 122 are conductive lines and vias, respectively, and are formed of conductive materials, such as copper, tungsten, aluminum, gold, silver, alloys thereof and the like.

Referring to the cell region 100A, an exemplary memory cell 130 is arranged between the Nth metal line 121 and the (N+1)th metal via layer. In some embodiments, the metal line 123 is arranged in the (N+1)th metal line layer 123L over the memory cell 130 and has a reduced height as compared to the metal line 123 of the logic region 100B, and thus the memory cell 130 is arranged between the Nth metal line 121 and the (N+1)th metal line layer 123L. Because the Nth metal line layer 121L may not be the first metal line layer over the transistor structure 101, the omission of a portion of the metallization structure 102 is represented by dots.

In some embodiments, the aforesaid metal line or the metal via is laterally surrounded by one or more dielectric layers 140 and 142. Each of the dielectric layers 140 or 142 may be an inter-metal dielectric (IMD) layer and formed of oxides such as un-doped silicate glass (USG), fluorinated silicate glass (FSG), low-k dielectric materials, or the like. The low-k dielectric materials may have k values lower than 3.8, although the dielectric material of the dielectric layers 140 and 142 may also be close to 3.8. In some embodiments, the k values of the low-k dielectric materials are lower than about 3.0, and may be lower than about 2.5. In some embodiments, the dielectric layers 140 or 142 are formed of extreme low-k (ELK) dielectric oxide.

In some embodiments, the metal line layers or the metal via layers are further separated by one or more etch stop layers 144 and 146. In some embodiments, the etch stop layers 144 and 146 comprise dielectric materials and serve as etch stop layers during etching trenches or recesses in the respective metal line layer or metal via layer, in which the conductive materials can be deposited into these trenches or recesses for forming metal lines or metal vias. In some embodiments, the etch stop layers 144 and 146 are chosen to have different materials having different etching selectivity properties and are arranged in a stack for improving etching performance. For example, in some embodiments, the etch stop layer 144 is formed of silicon carbide nitride (SiCN), silicon oxide, silicon nitride, silicon oxynitride, silicon carbide, or other low-k oxide material. In some embodiments, the etch stop layer 146 is aluminum oxide.

Referring to the cell region 100A, the memory cell 130 at least includes a bottom electrode via (BEVA) 132, a bottom electrode 134, an MTJ 136 and a top electrode 138. The bottom electrode 134, the MTJ 136 and the top electrode 138 are collectively referred to as a memory element 130M. In some embodiments, the BEVA 132 is formed over and electrically coupled to the Nth metal line 121. In some embodiments, the BEVA 132 is laterally surrounded by the dielectric stack formed of the etch stop layers 144 and 146. In some embodiments, the BEVA 132 is further laterally surrounded by a dielectric layer 141. The dielectric layer 141 may be formed of oxides such as low-k dielectric materials. In some embodiments, the dielectric layer 141 may include materials similar to those of the dielectric layers 140 and 142. The BEVA 132 may be formed in a trench possessing a trapezoidal recess. In some embodiments, the BEVA 132 may include conductive materials such as tungsten (W), copper (Cu), tantalum nitride (TaN), titanium nitride (TiN), tantalum (Ta) or other suitable materials.

In some embodiments, the BEVA 132 of the memory cell 130 is electrically coupled to a doped region of the transistor structure 101, in which the doped region is a drain region 105 or a source region 103. In other embodiments, the BEVA 132 of the memory cell 130 is electrically coupled with the gate region 107 of the transistor structure 101.

The bottom electrode 134 is arranged over the BEVA 132. In some embodiments, the bottom electrode 134 may include conductive materials such as TiN, TaN, Ti, Ta or Ru. The MTJ 136 is disposed over the bottom electrode 134. In some embodiments, the MTJ 136 includes a layer stack (not separately shown), including a free layer, a tunnel barrier layer, and a reference layer disposed over one another. The top electrode 138 is disposed over the MTJ 136. In some embodiments, the top electrode 138 may include conductive materials such as TiN, TaN, W, Ti, Ta or Ru. In some embodiments, the top electrode 138 and the bottom electrode 134 are made of a same material. In some embodiments, the material of the top electrode 138 is different from that of the BEVA 132. In some embodiments, the top electrode 138 includes a multilayer structure.

As shown in FIG. 1, sidewalk of the bottom electrode 134 and the MTJ 136, and a portion of sidewalls of the top electrode 138 are laterally surrounded by a spacer 143. In some embodiments, the spacer 143 has a top surface substantially higher than or level with the bottom surface of the top electrode 138. In some embodiments, the spacer 143 includes silicon nitride (SiN).

In some embodiments, the memory cell 130 is further laterally surrounded by one or more protection layers 145 and 147. In some embodiments, the protection layers 145 and 147 comprise dielectric materials. In some embodiments, the protection layers 145 and 147 are chosen to have different materials. For example, in some embodiments, the protection layer 145 is formed of aluminum oxide. In some embodiments, the protection layer 147 includes atomic layer deposition (ALD) oxide and is formed by an ALD process. The protection layer 145 may have a top surface substantially level with the top surface of the spacer 143. In some embodiments, the protection layer 147 has a top substantially level with the top surface of the protection layer 145.

Referring to the mark region 100C, an exemplary alignment mark 150 is arranged between the (N−1)th metal via layer 120L and the (N+1)th metal line layer 123L. The alignment mark 150 in the mark region 100C may be horizontally corresponding to a portion of the Nth metal line layer 121L and a portion of the Nth metal via layer 122L in the logic region 100B. In some embodiments, the alignment mark 150 may include alignment mark layers (simply, mark layers) 152, 154, 156 and 158. The mark layer 152 can include materials similar to those of the BEVA 132. The mark layer 154 can include materials similar to those of the bottom electrode 134. The mark layer 154 and the bottom electrode 134 have substantially equal thicknesses. In some embodiments, a material of the alignment mark 150 is substantially same as a material of the bottom electrode 134. The mark layer 156 can include materials similar to those of the MTJ 136. In some embodiments, the mark layer 156 and the MTJ 136 have substantially equal thicknesses. The mark layer 158 can include materials similar to those of the top electrode 138. In some embodiments, the mark layer 158 and the top electrode 138 have substantially equal thicknesses. In some embodiments, the top surfaces of the mark layers 152, 154, 156 and 158 are coplanar to one another. In some embodiments, a depth D1 of the alignment mark 150 is greater than or equal to 800 angstroms. Referring to FIG. 2C, a width W1 of the alignment mark 150 may be greater than or equal to 200 angstroms. In some embodiments, a length L1 of the alignment mark 150 may be greater than or equal to 2 microns. In some embodiments, the mark layer 152 laterally surrounds the mark layers 154, 156 and 158.

Figure 3:
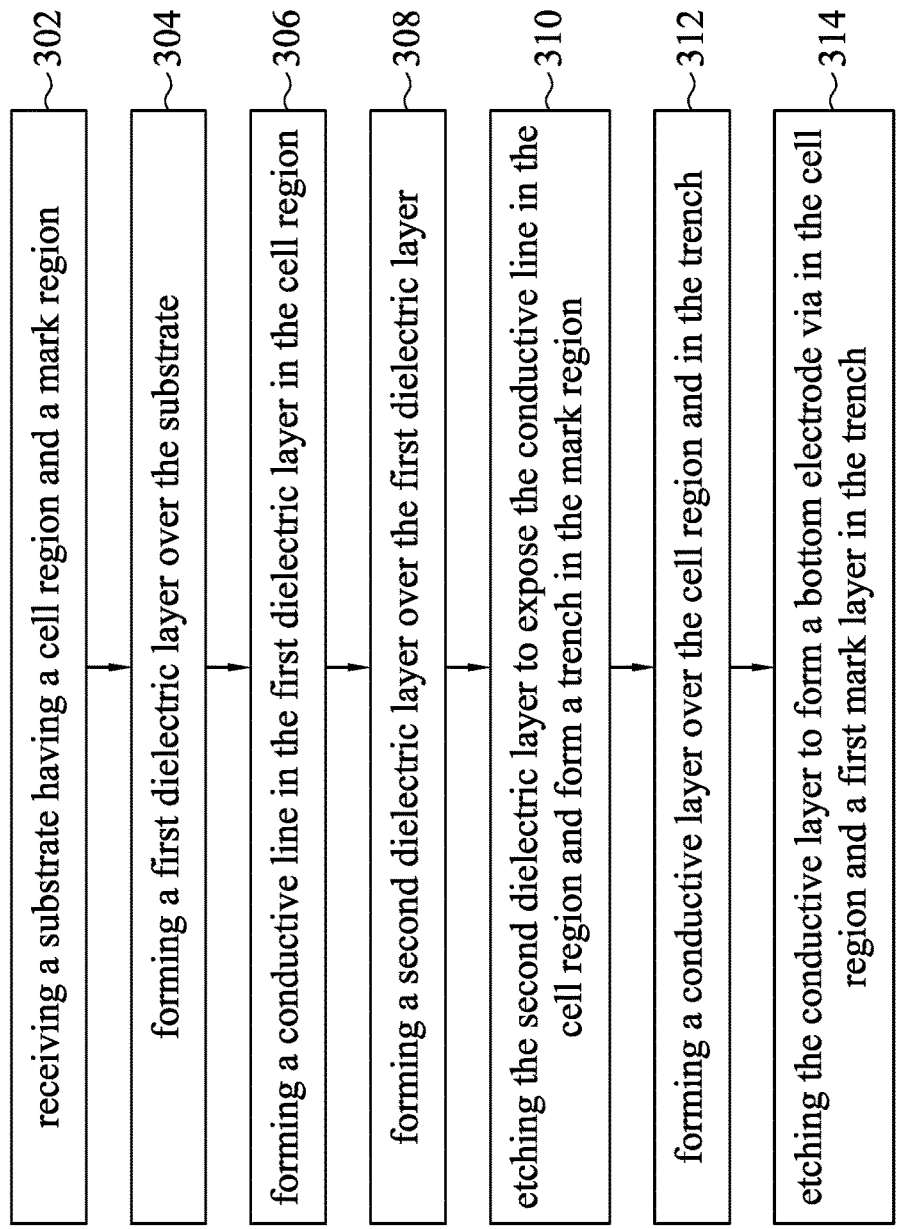
FIG. 3 is a flowchart representing a method for forming a semiconductor structure, in accordance with some embodiments of the present disclosure.

FIG. 3 is a flowchart representing a method 30 for forming a semiconductor structure, e.g., the semiconductor structure 10 shown in FIG. 1, in accordance with some embodiments of the present disclosure. It is understood that additional steps can be provided before, during, and after the method 30, and some of the steps described can be replaced or eliminated for other embodiments of the method 30. It should also be understood that the order of the operations in the method 30 can be altered according to different implementations. The method 30 for forming a semiconductor structure includes an operation 302 where a substrate is received. In some embodiments, the substrate includes a cell region and a mark region. The method 30 further includes an operation 304 where a first dielectric layer is formed over the substrate. The method 30 further includes an operation 306 where a conductive line is formed in the first dielectric layer in the cell region. The method 30 further includes an operation 308 where a second dielectric layer is formed over the first dielectric layer. The method 30 further includes an operation 310 where the second dielectric layer is etched to expose the conductive line in the cell region and form a trench in the mark region. The method 30 further includes an operation 312 where a conductive layer is formed over the cell region and in the trench. The method 30 further includes an operation 314 where the conductive layer is etched to form a bottom electrode via in the cell region and a first mark layer in the trench.

Figure 4A:
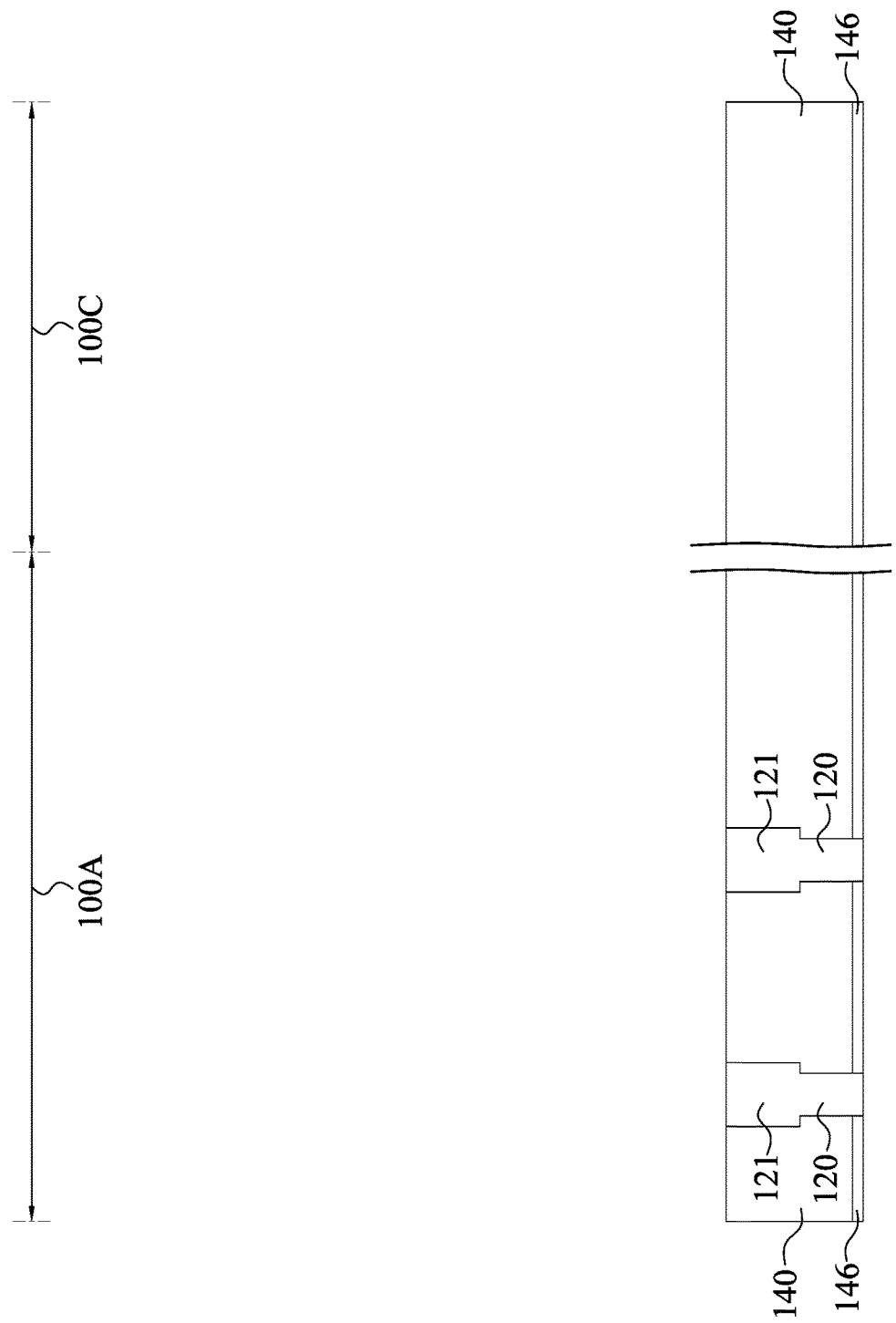
FIGS. 4A-4N are schematic diagrams illustrating cross-sectional views of intermediate stages of a method for manufacturing a semiconductor structure, in accordance with some embodiments of the present disclosure.
Figure 4B:
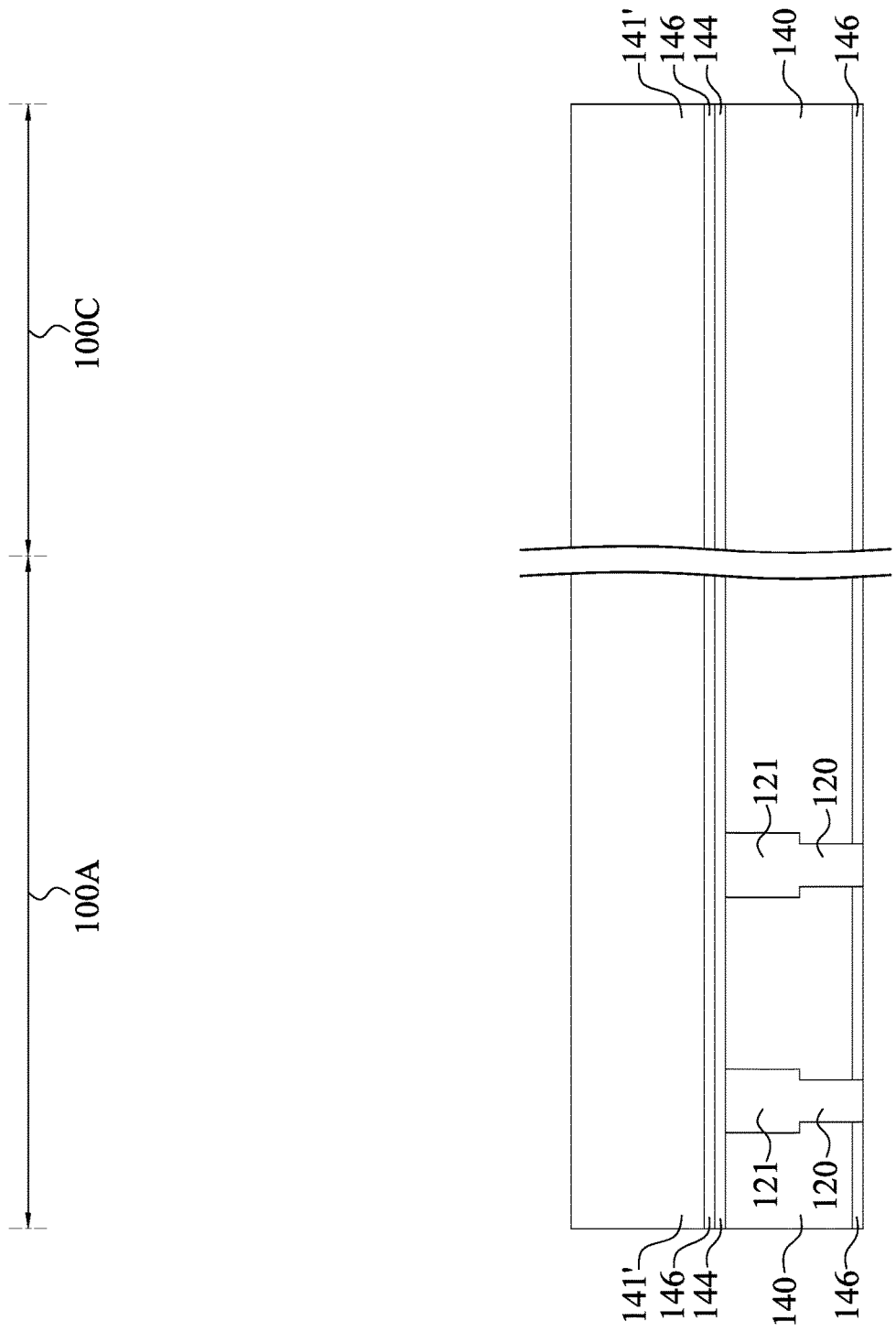
Figure 4C:
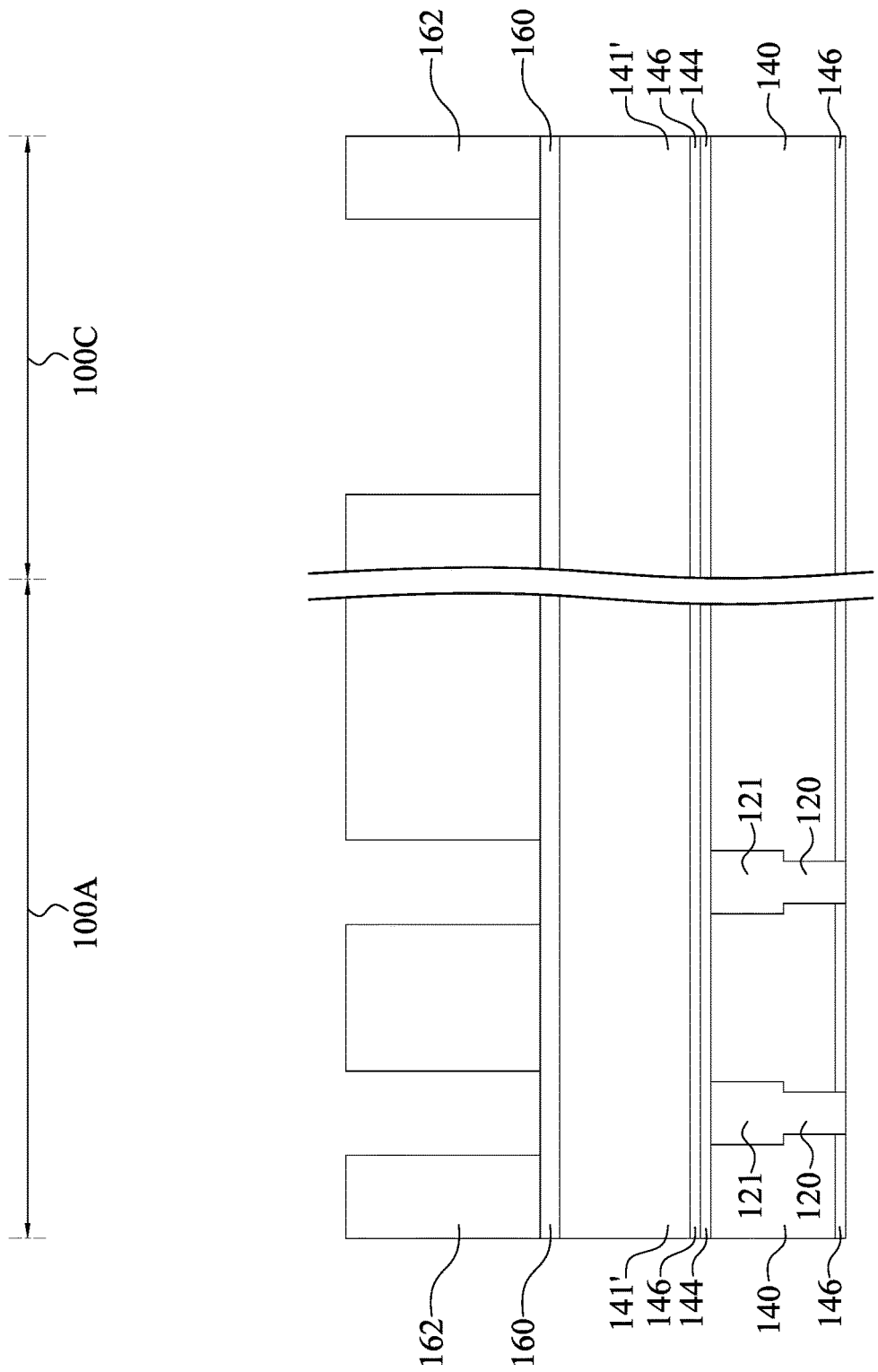
Figure 4D:
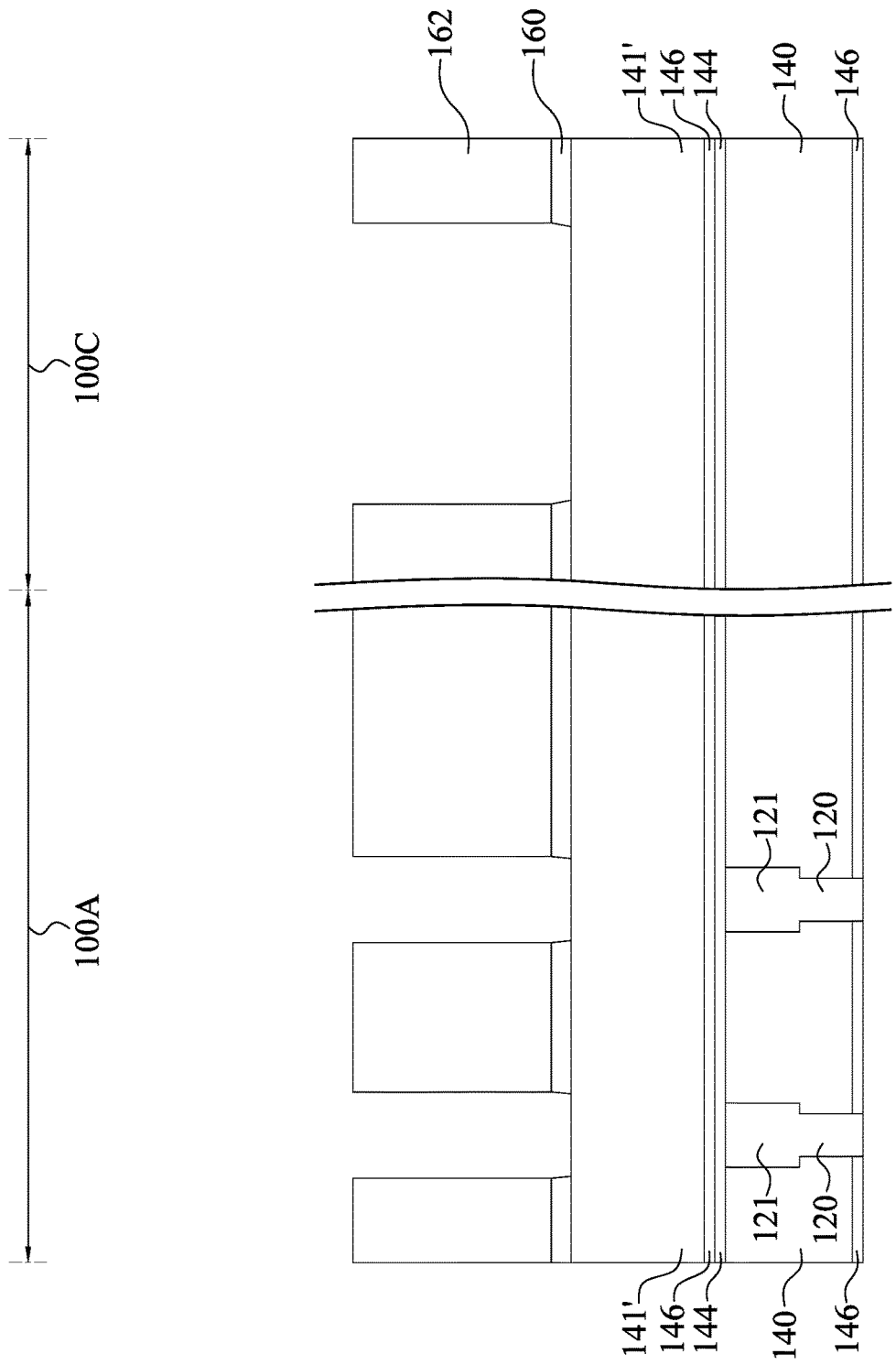
Figure 4E:
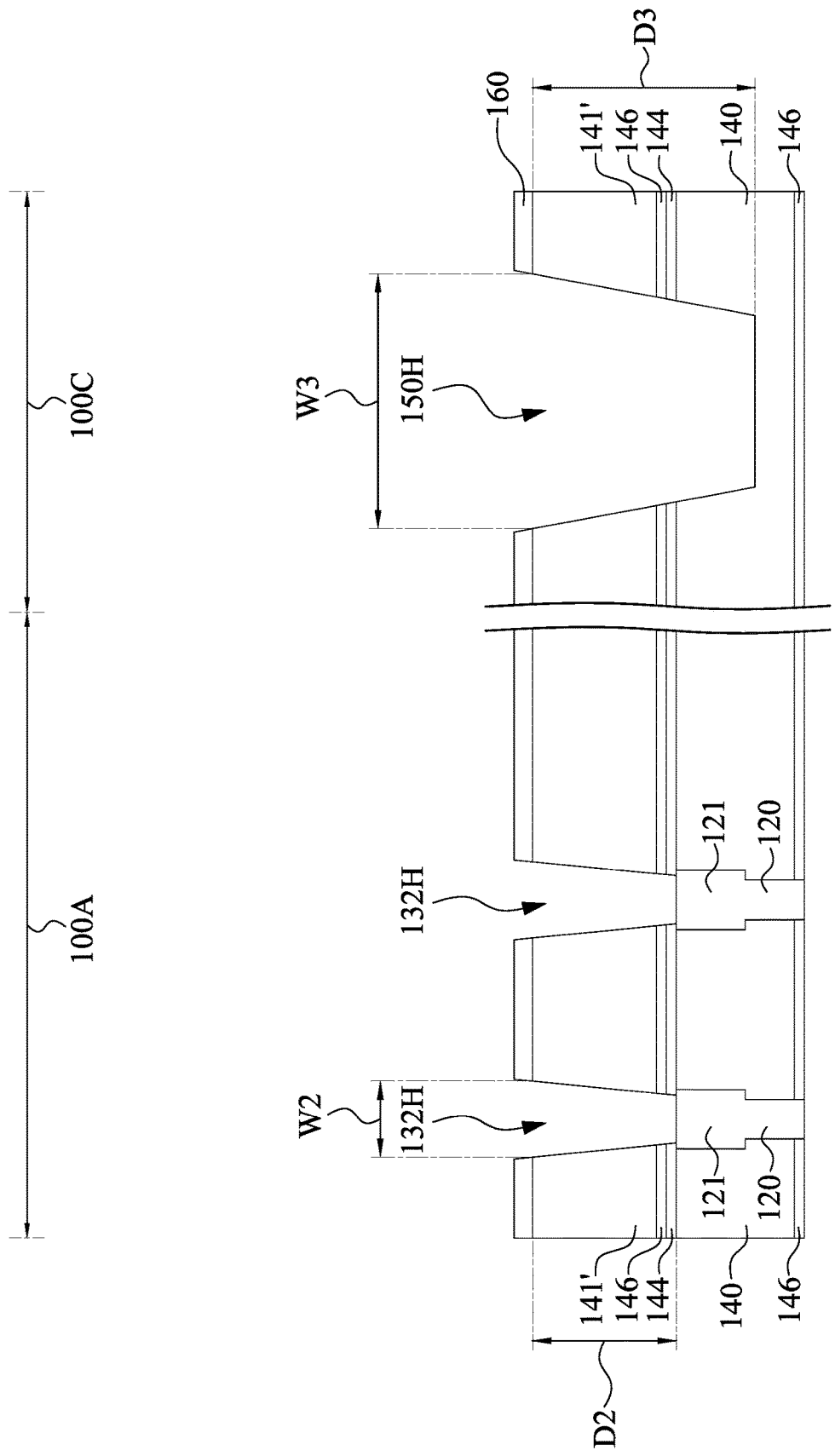
Figure 4F:
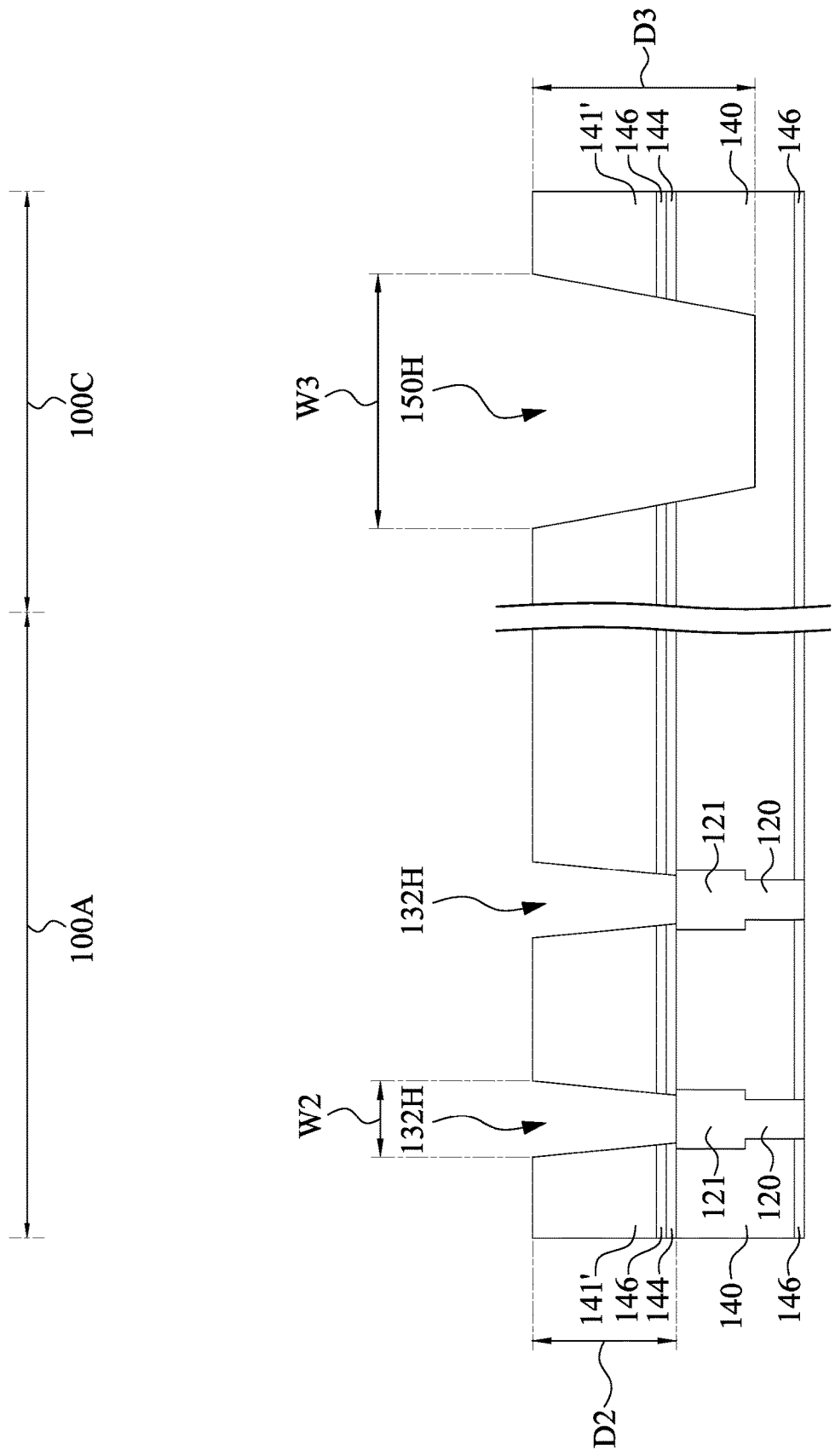
Figure 4G:
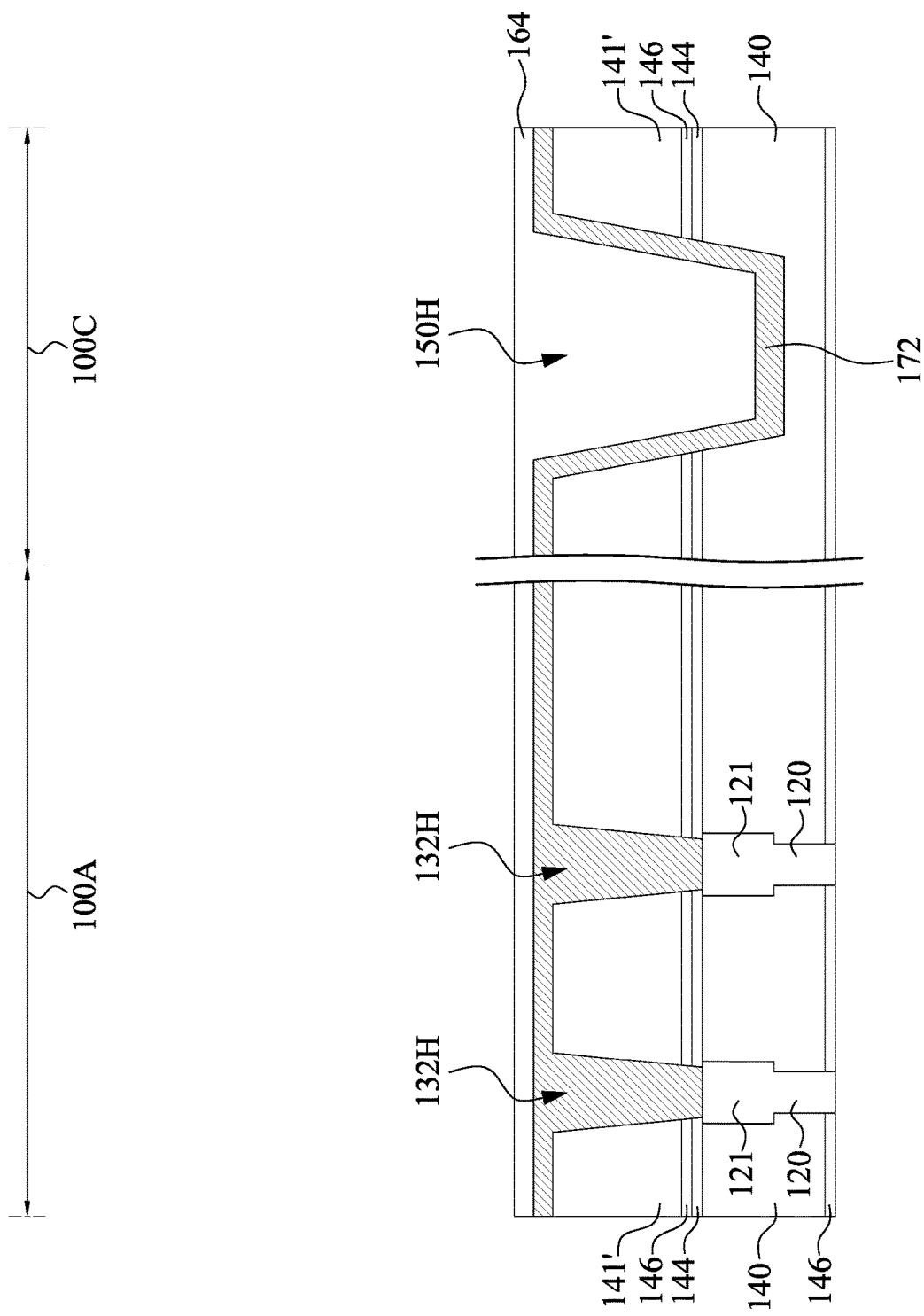
Figure 4H:
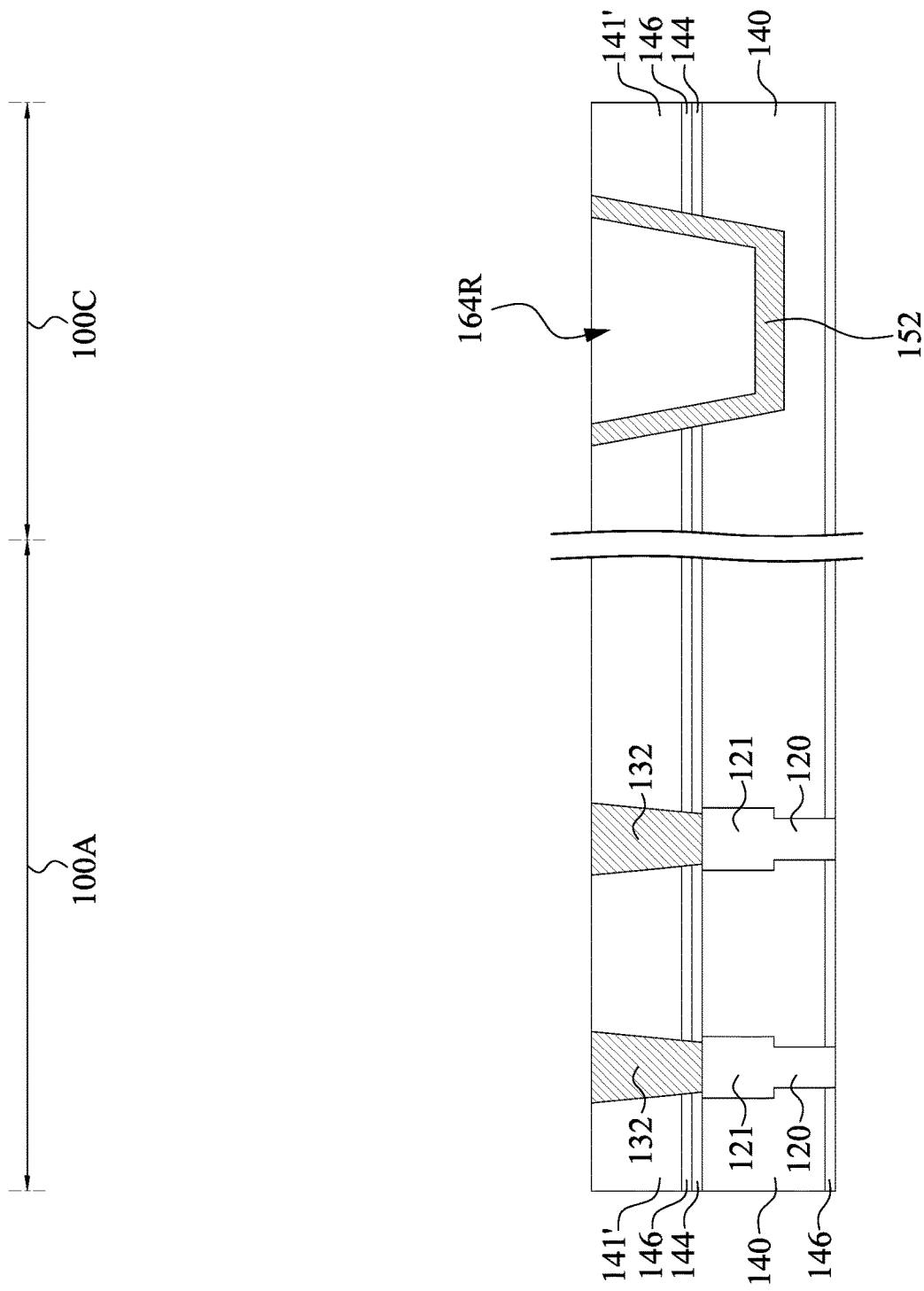
Figure 4I:
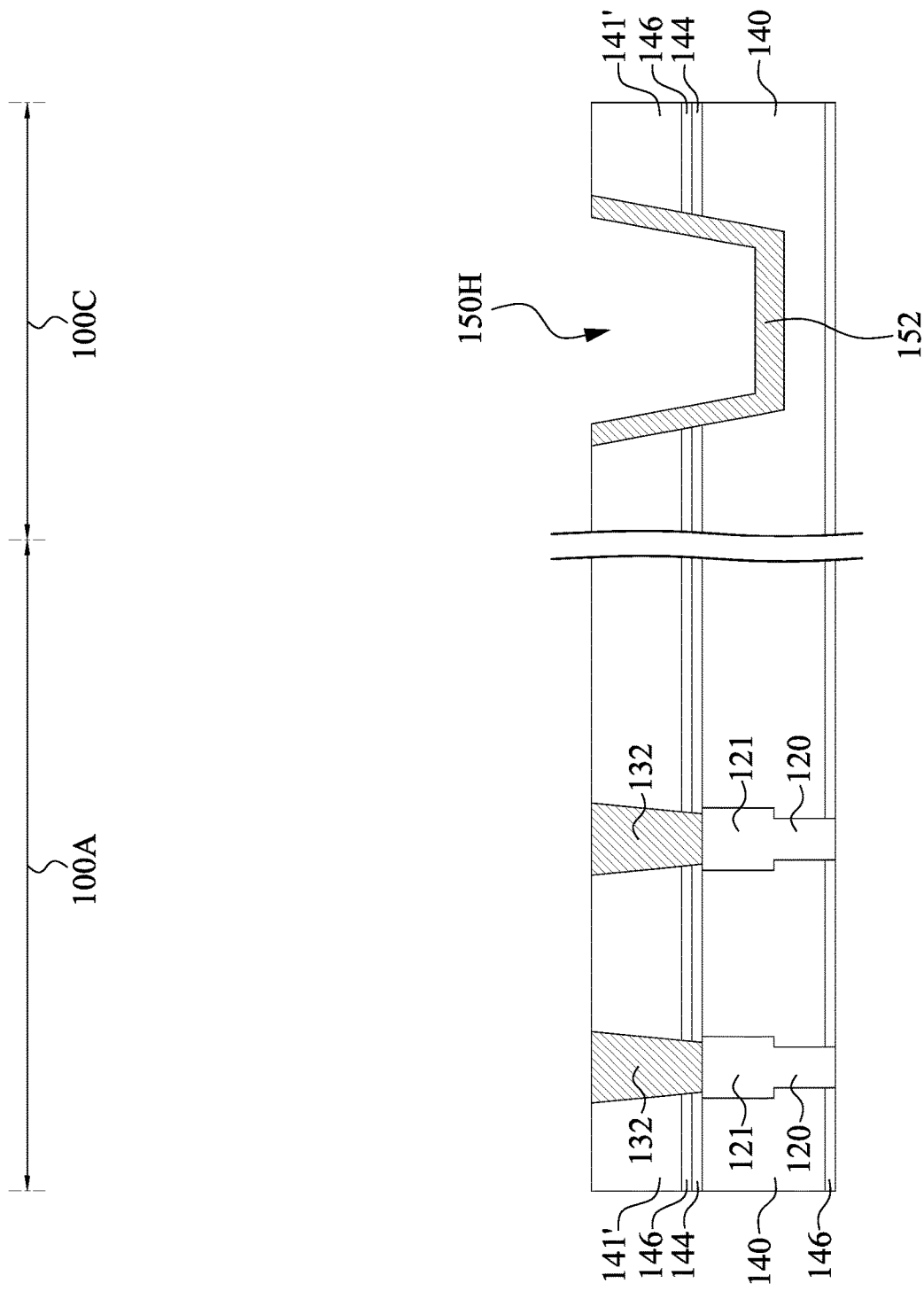
Figure 4J:
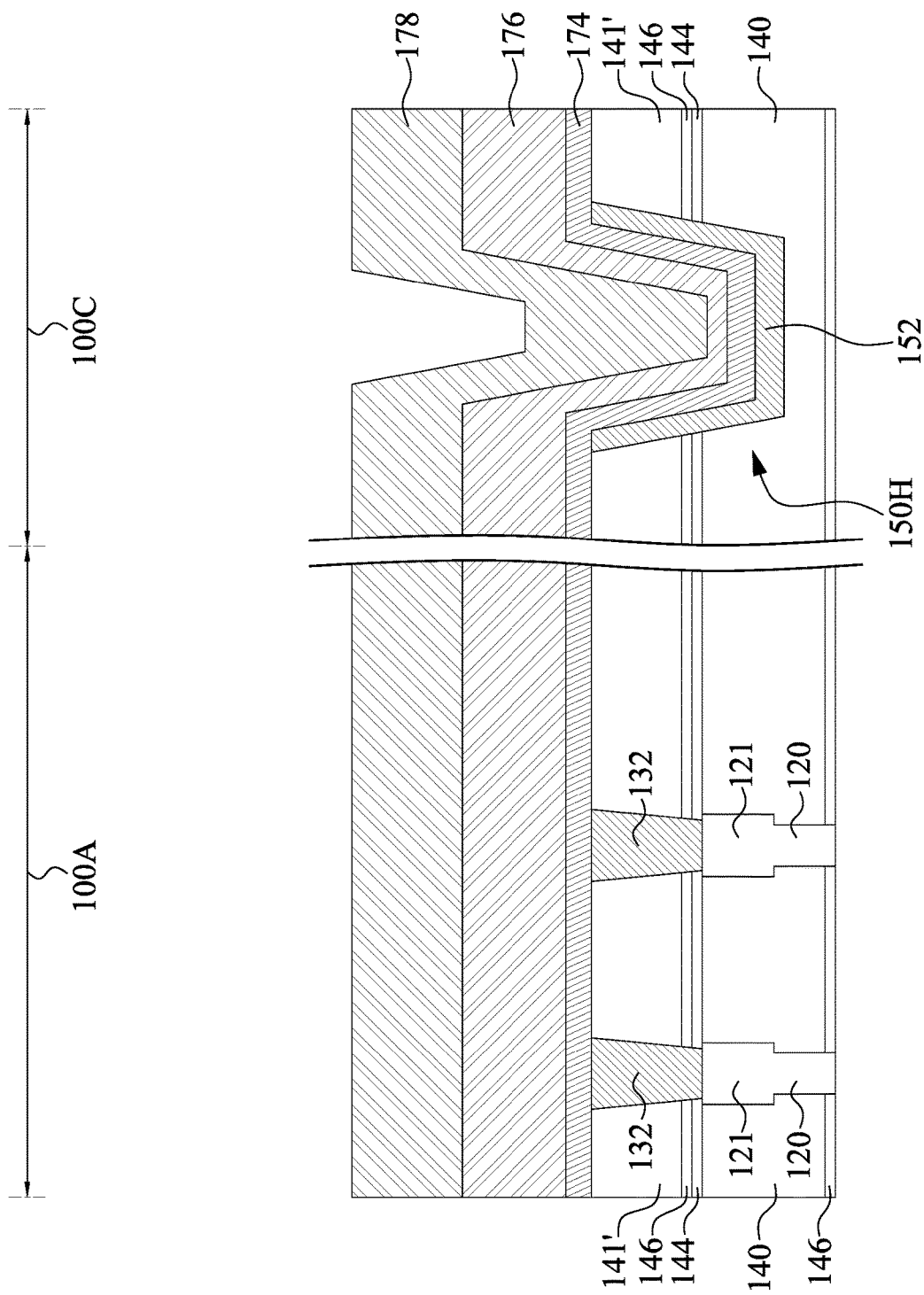
Figure 4K:
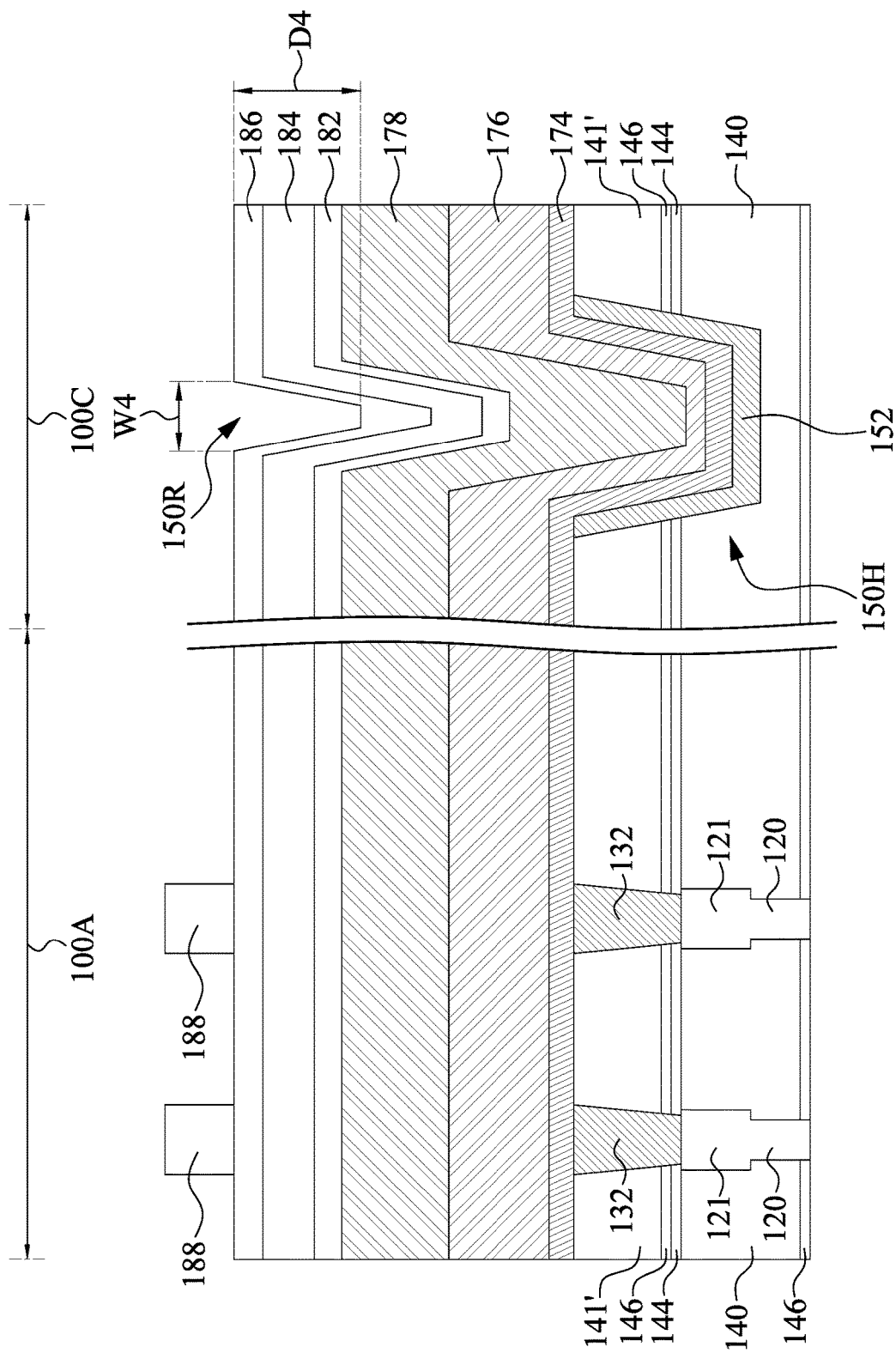
Figure 4L:
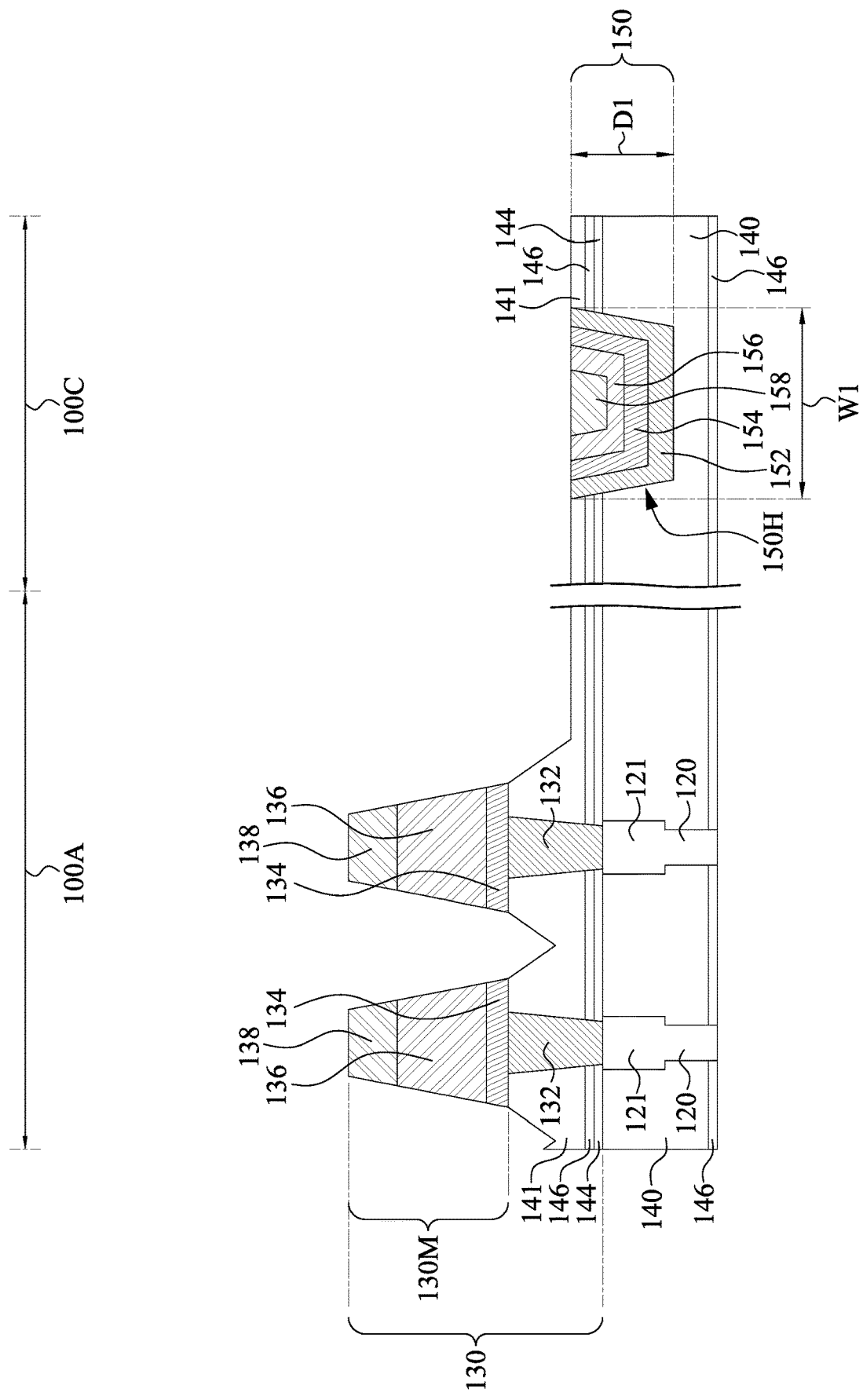
Figure 4M:
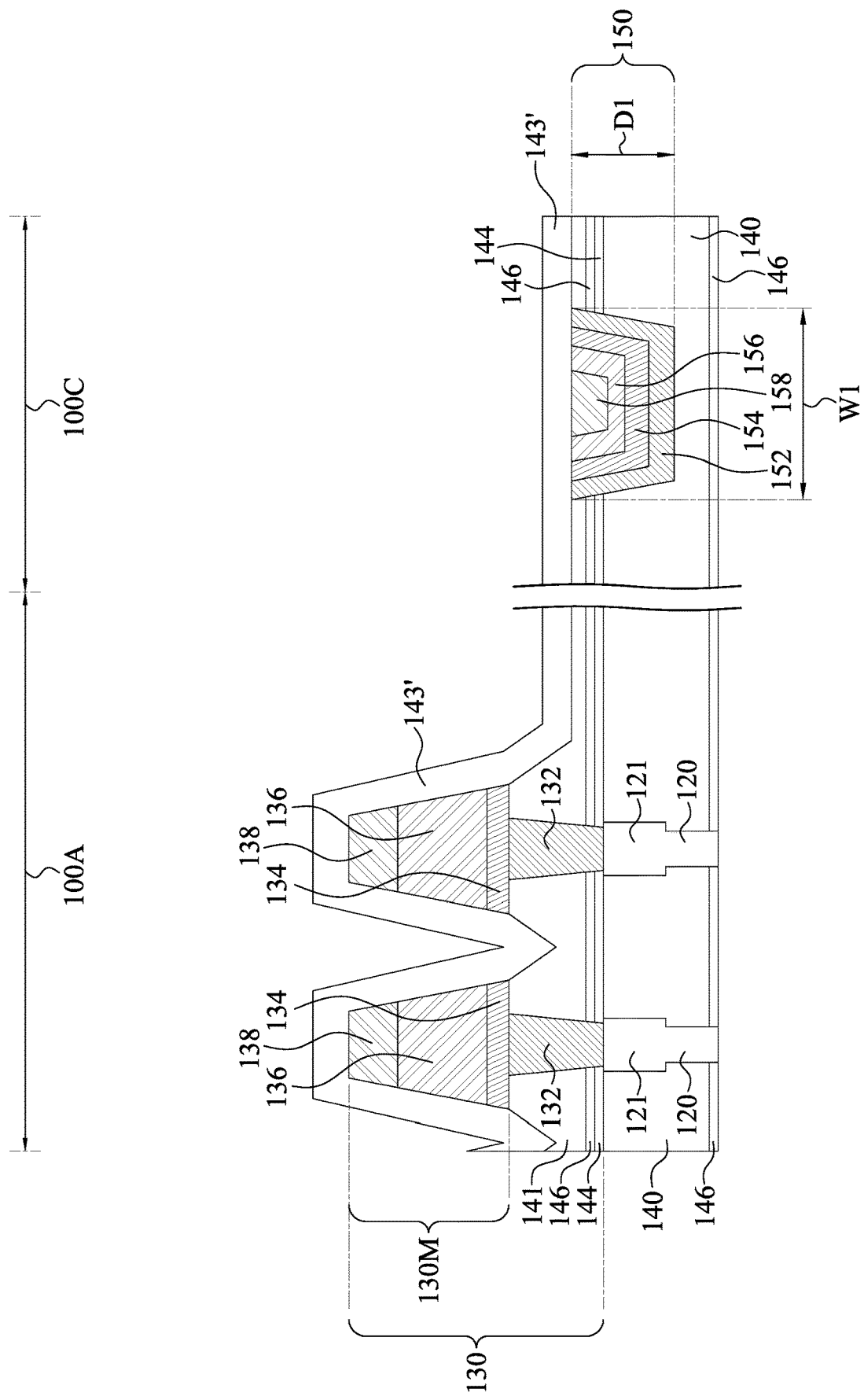
Figure 4N:
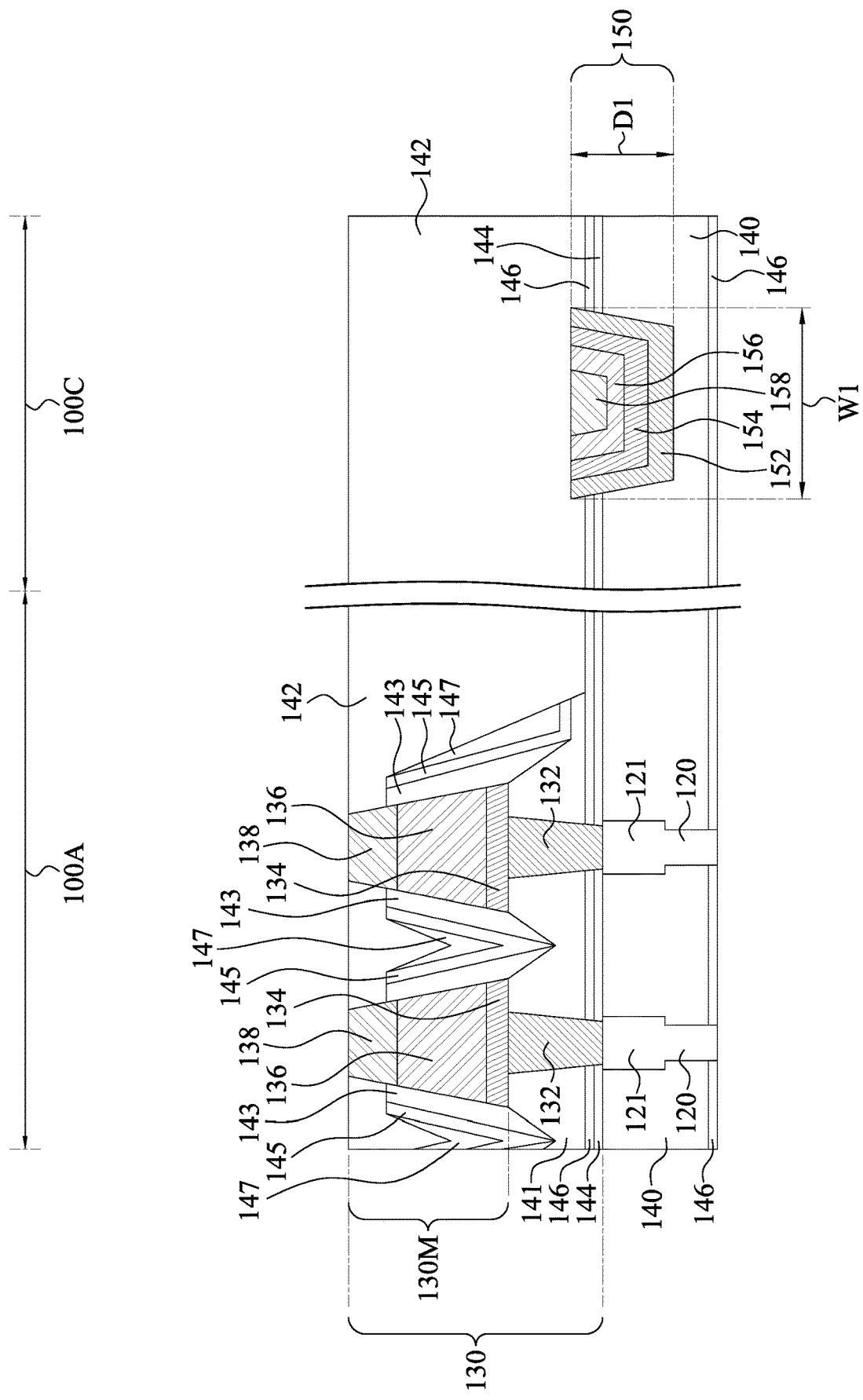

FIGS. 4A-4N are schematic diagrams illustrating cross-sectional views of intermediate stages of a method for manufacturing a semiconductor structure, e.g., the semiconductor structure 10 shown in FIG. 1, in accordance with some embodiments of the present disclosure. The illustration is merely exemplary and is not intended to be limiting beyond what is specifically recited in the claims that follow. It is understood that additional operations may be provided before, during, and after the operations shown by FIGS. 4A-4N, and some of the operations described below can be replaced or eliminated for additional embodiments of the method. The order of the operations/processes may be interchangeable. In addition, only the cell region 100A and the mark region 100C are shown in FIGS. 4A-4N for illustrative purposes.

Referring to FIG. 4A, operation 302 is performed. A substrate (e.g., the substrate 100 in FIG. 1, but not shown in FIG. 4A) having a predetermined cell region 100A and a mark region 100C is received or provided. In some embodiments, a transistor structure is formed in the substrate. The integrated circuit device including the transistor structures 101 shown in FIG. 1 may undergo further CMOS or MOS technology processing to form various features known in the art.

Operations 304 and 306 are performed. A first dielectric layer (e.g., a dielectric layer 140, to be described later) is formed over the substrate, and a conductive line (e.g., a Nth metal line 121, to be described later) is formed in the first dielectric layer in the cell region. FIG. 4A also illustrates the formation of at least part of the metallization structure 102 shown in FIG. 1. In some embodiments, a dielectric layer 140 is formed over the substrate. The dielectric layer 140 may be patterned. An Nth metal line 121 is formed in the patterned dielectric layer 140 in the cell region 100A. In some embodiments, an (N−1)th metal via 120 is also formed in the patterned dielectric layer 140 in the cell region 100A. The Nth metal line 121 and the (N−1)th metal via 120 may be formed over the transistor structure. The Nth metal line 121 and the (N−1)th metal via 120 are a conductive line and a conductive via, respectively, and are formed of conductive materials, such as copper, tungsten, aluminum, gold, silver, alloys thereof and the like. In some embodiments, the Nth metal line 121 and the (N−1)th metal via 120 can be formed by an electroplating operation, in which a seed layer may be deposited over the patterned dielectric layer 140 prior to the forming of the conductive materials. In other embodiments, the Nth metal line 121 and the (N−1)th metal via 120 may be formed by a variety of techniques, e.g., electroless plating, high-density ionized metal plasma (IMP) deposition, high-density inductively coupled plasma (ICP) deposition, sputtering, physical vapor deposition (PVD), chemical vapor deposition (CVD), low-pressure chemical vapor deposition (LPCVD), plasma-enhanced chemical vapor deposition (PECVD), and the like. A planarization operation is performed to expose a top surface of the Nth metal line 121 and the top surface of the dielectric layer 140. In some embodiments, the mark region 100C is free of the Nth metal line 121 and the (N−1)th metal via 120.

Referring to FIG. 4B, operations 308 is performed. A second dielectric layer (e.g., a dielectric layer 141', to be described later) is formed over the first dielectric layer. In some embodiments, a stack of etch stop layers 144 and 146 and a dielectric layer 141' are blanket deposited over a top surface of the Nth metal line 121 and a top surface of the dielectric layer 140 in both the cell region 100A and the mark region 100C. In some embodiments, the etch stop layers 144 and 146 are formed of SiCN and aluminum oxide, respectively, and the dielectric layer 141' is formed of low-k dielectric materials. The etch stop layers 144, 146 and the dielectric layer 141' can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Referring to FIG. 4C, a hard mask layer 160 is deposited over a top surface of the dielectric layer 141' in both the cell region 100A and the mark region 100C. A photoresist layer 162 is formed over the hard mask layer 160 to pattern the hard mask layer 160. In some embodiments, the hard mask layer 160 may include conductive materials such as TiN, TaN, Ta or other suitable materials. The hard mask layer 160 can be formed by a variety of techniques, e.g., chemical vapor deposition (CVD), low-pressure CVD (LPCVD), plasma-enhanced CVD (PECVD), sputtering and physical vapor deposition (PVD), thermal growing, and the like.

Referring to FIG. 4D, the hard mask layer 160 is patterned over the dielectric layer 141' according to the pattern of the photoresist layer 162. The photoresist layer 162 may be removed or stripped after the hard mask layer 160 is patterned.

Referring to FIG. 4E, operation 310 is performed. The second dielectric layer (e.g., the dielectric layer 141') is etched to expose the conductive line (e.g., the Nth metal line 121) in the cell region and form a trench (e.g., a trench 150H, to be described later) in the mark region. Operation 310 may be referred to as a patterning operation. The patterning operation is performed to expose one or more BEVA holes 132H in the cell region 100A and one or more trenches 150H in the mark region 100C. In some embodiments, the patterning operation may be performed by a selective etching operation, e.g., a wet etch, a dry etch, or a combination thereof, such as RIE, with the patterned hard mask layer 160 serving as the etching mask. Referring to the cell region 100A, the etch proceeds through the dielectric layer 141', the etch stop layers 144, 146, and stops at the top surface of the Nth metal line 121. The dielectric layer 141' is etched to expose the underlying Nth metal line 121. The top surface of the Nth metal line 121 are exposed through the BEVA holes 132H during the selected etching operation. In some embodiments, the Nth metal line 121 is kept substantially intact during the selective etching operation.

Referring to the mark region 100C, the etch proceeds through the dielectric layer 141', the etch stop layers 144, 146, and the dielectric layer 140 and stops until a predetermined depth, such as a depth D3, is reached. The trench 150H is etched to the depth D3 greater than a depth D2 of the BEVA holes 132H. The trench 150H extends through the dielectric layer 141'. The trench 150H extends to a depth of the dielectric layer 141'. The dielectric layer 140 may have a reduced height in the mark region 100C as compared to the dielectric layer 140 in the cell region 100A. The etch may extend within the dielectric layer 140 in the mark region 100C since there is no etching stop layers, such as a metal line (such as the Nth metal line 121) or a metal via (such as the (N−1)th metal via 120) formed in the dielectric layer 140. In contrast, the dielectric layer 140 in the cell region 100A is protected by the Nth metal line 121 such that a top surface of the dielectric layer 140 is not exposed.

Referring to FIG. 4F, the hard mask layer 160 is removed. In some embodiments, an etching operation is performed to remove the hard mask layer 160. In some embodiments, a width W3 of the trench 150H is greater than a width W2 of the BEVA holes 132H. In some embodiments, the width W3 of the trench 150H may be greater than or equal to 200 angstroms. In some embodiments, the depth D3 of the trench 150H is greater than the depth D2 of the BEVA holes 132H. In some embodiments, the depth D3 of the trench 150H may be greater than or equal to 800 angstroms. In some embodiments, a size of the trench 150H is greater than a size of the BEVA hole 132H.

Referring to FIG. 4G, operation 312 is performed. A conductive layer a conductive layer 172, to be described later) over the cell region and in the trench. In some embodiments, a conductive layer 172 is deposited over a top surface of the dielectric layer 141', in both the cell region 100A and the mark region 100C. The conductive layer 172 is further deposited in the BEVA holes 132H in the cell region 100A and the trench 150H in the mark region 100C. In some embodiments, the conductive layer 172 may include conductive materials such as tungsten (W), copper (Cu), tantalum nitride (TaN), titanium nitride (TiN), tantalum (Ta) or other suitable materials. Subsequently, a sacrificial layer 164 is deposited over the conductive layer 172. The sacrificial layer 164 is further deposited in the trench 150H in the mark region 100C. The sacrificial layer 164 is extended in the trench 150H. The sacrificial layer 164 may serve as a mask layer or an etch buffer structure for subsequent operations, such as etching operation or planarization operation. In some embodiments, the sacrificial layer 164 is formed of a dielectric material, such as oxide, nitride, oxynitride, or other suitable dielectric materials. In some embodiments, the sacrificial layer 164 includes silicon nitride (SiN) to provide sufficient etching selectivity with respect to the conductive layer 172. The conductive layer 172 and the sacrificial layer 164 may be formed by a variety of deposition techniques now known or later developed.

Referring to the cell region 100A, the conductive layer 172 may fill up the BEVA holes 132H. The sacrificial layer 164 is absent from the BEVA holes 132H since the BEVA holes 132H are filled up with the conductive layer 172. In some embodiments, an overfilling of the conductive layer 172 is carried out with a thickness over the horizontal surface of the dielectric layer 141'. Referring to the mark region 100C, the trench 150H may not be filled up by the conductive layer 172 since the trench 150H is deeper than the BEVA holes 132H. The conductive layer 172 may be deposited on the bottom surface and the sidewalk of the trench 150H in a gap-fill manner. However, the trench 150H is not filled up with the conductive layer 172 since the trench 150H is deep and large. A recess is formed on the top surface of the conductive layer 172 at this stage. In other embodiments, the conductive layer 172 may be deposited on the bottom surface and the sidewalk of the trench 150H in a conformal manner. The sacrificial layer 164 is further deposited in the trench 150H. The sacrificial layer 164 and the conductive layer 172 may altogether filled up the trench 150H. In some embodiments, an overfilling of the sacrificial layer 164 is carried out with a thickness over the horizontal surface of the conductive layer 172 in the cell region 100A.

Referring to FIGS. 4H-4I, operation 314 is performed. The conductive layer (e.g., the conductive layer 172) is etched to form a bottom electrode via (e.g., a bottom electrode via 132, to be described later) in the cell region and a first mark layer (e.g., a mark layer 152, to be described later) in the trench. Referring to FIG. 4H, the conductive layer 172 and the sacrificial layer 164 are then etched back to be level with a top surface of the dielectric layer 141'. In some embodiments, a planarization operation, such as a chemical mechanic planarization (CMP) operation, may be carried out to form a flat top surface of the conductive layer 172 and the sacrificial layer 164. In some embodiments, a thinning operation such as an etching process is performed on the dielectric layer 141' such that the top surface of the dielectric layer 129 is substantially flat across the cell region 100A. As a result, the sacrificial layer 164 in the cell region 100A is removed, leaving a mark layer 152 and residual portions (a sacrificial element 164R) of the sacrificial layer 164 in the trench 150H, and bottom electrode vias (BEVA) 132 in the BEVA holes 132H. In some embodiments, the mark layer 152 fills the trench 150H with the sacrificial element 164R. Referring to FIG. 4I, subsequently, the sacrificial element 164R is removed from the trench 150H of the mark region 100C, leaving the mark layer 152 in the trench 150H. The mark layer 152 may be referred to as a first mark layer.

Referring to FIG. 4J, a bottom electrode layer 174 is deposited on the planarized surface of the BEVA 132 in the cell region 100A and the mark layer 152 in the mark region 100C. The bottom electrode layer 174 is further deposited in the trench 150H in the mark region 100C. The bottom electrode layer 174 may comprise TiN, TaN, Ta or Ru. The bottom electrode layer 174 may be deposited on the bottom surface and the sidewalls of the conductive layer 172 in a gap-fill manner. However, the trench 150H is not filled up with the bottom electrode layer 174 since the trench 150H is deep and large. A recess is formed on the top surface of the bottom electrode layer 174 at this stage. In other embodiments, the bottom electrode layer 174 may be deposited on the bottom surface and the sidewalls of the conductive layer 172 in a conformal manner. The bottom electrode layer 174 may be formed by a variety of deposition techniques now known or later developed.

Then, an MTJ layer 176 is deposited in a form of a multilayer stack over the bottom electrode layer 174. The MTJ layer 176 is further deposited in the trench 150H in the mark region 100C. In some embodiments, the MTJ layer 176 includes a magnetic material layer. The MTJ layer 176 may include ferromagnetic layers, interlayers, and a capping layer. The ferromagnetic layer may function as a free layer whose magnetic polarity or magnetic orientation can be changed during write operation of its associated MRAM cell. Another ferromagnetic layer and the interlayer may function as a fixed or reference layer whose magnetic orientation may not be changed during operation of its associated MRAM cell. The capping layer is formed on the ferromagnetic layer and may reduce write current of its associated MRAM cell. Each of the ferromagnetic layers may include ferromagnetic materials, which may be metal or metal alloy, for example, Fe, Co, Ni, CoFeB, FeB, CoFe, FePt, FePd, CoPt, CoPd, CoNi, TbFeCo, CrNi or the like. The interlayers may include non-ferromagnetic metal, for example, Ag, Au, Cu, Ta, W, Mn, Pt, Pd, V, Cr, Nb, Mo, Tc, Ru or the like. The capping layer may include non-ferromagnetic material, which may be a metal or an insulator, for example, Ag, Au, Cu, Ta, W, Mn, Pt, Pd, V, Cr, Nb, Mo, Tc, Ru, Ir, Re, Os, Al2O3, MgO, TaO, RuO or the like. It is contemplated that the MTJ layer 176 may include an antiferromagnetic layer in accordance with other embodiments.

The MTJ layer 176 may be deposited on the bottom surface and the sidewalls of the bottom electrode layer 174 in a gap-fill manner. However, the trench 150H is not filled up with the MTJ layer 176 since the trench 150H is deep and large. A recess is formed on the top surface of the MTJ layer 176 at this stage. In other embodiments, the MTJ layer 176 may be deposited on the bottom surface and the sidewalls of the bottom electrode layer 174 in a conformal manner. The MTJ layer 176 may be formed by variety of deposition techniques now known or later developed.

A top electrode layer 178 is deposited over the MTJ layer 176. The top electrode layer 178 is further deposited in the trench 150H in the mark region 100C. In some embodiments, the top electrode layer 178 is a conductive layer and comprises a conductive material, such as TiN, TaN, Ti, Ta or Ru. The top electrode layer 178 may be deposited on the bottom surface and the sidewalls of the MTJ layer 176 in a gap-fill manner. In some embodiments, the trench 150H is filled up with the top electrode layer 178. A recess is formed on the top surface of the top electrode layer 178 since the trench 150H is deep and large. In other embodiments, the top electrode layer 178 may be deposited on the bottom surface and the sidewalk of the MTJ layer 176 in a conformal manner. The top electrode layer 178 may be formed by a variety of deposition techniques now known or later developed.

Referring to FIG. 4K, a stack of mask layers 182, 184 and 186 is formed over the top electrode layer 178. In some embodiments, since the trench 150H is filled up with the mark layer 152, the bottom electrode layer 174, the MTJ layer 176 and the top electrode layer 178, the trench 150H is substantially free of the mask layers 182, 184 and 186. A recess or trench 150S is formed on the top surface of the mask layer 186 at this stage, this recess 150R (topography) may serve as an alignment mark and be used for alignment of a mask, detail of which is to be described later. A top view of the recess 150R resembles one of the alignment marks 150 shown in FIG. 2C. In some embodiments, a width W4 of the recess 150R is less than the width W1 of the alignment marks 150. In some embodiments, the width W4 of the recess 150R is greater than about 200 angstroms. Also, a length of the recess 150R may be less than the length L1 of the alignment marks 150. In some embodiments, the length of the recess 150R is greater than about 2 microns. In some embodiments, a depth D4 of the recess 150R is less than or substantially equal to the depth D1 of the alignment marks 150. In some embodiments, the depth D4 of the recess 150R is greater than about 800 angstroms. In some embodiments, the width W4 and the depth D4 of the recess 150R are wide and deep enough such that the topography of the recess 150R enables the recess 150R to serve as an alignment mark successfully during an alignment operation of a photolithography process.

According to some embodiments of the present disclosure, the alignment marks (e.g., the recesses 150R) are formed without an additional lithography process. The alignment marks 150R may be formed through a series of operations, such as operations 302 to 314. During the patterning operation, such as the operation 310, the dielectric layer 141' is etched to expose the Nth metal line 121 in the cell region 100A (i.e., form the BEVA hole 132H in the cell region) and form the trench 150H in the mark region 100C. The trench 150H (which will be converted to the alignment mark 150R in later operations) is formed in the same operation for forming the BEVA holes 132H. Thus, no additional lithography process is needed for the formation of the trench 150H. Also, potential damage on the surface of the bottom electrode layer 174 may be eliminated or reduced since no cleaning or lithography process is needed before the MTJ layer 176 is deposited. Accordingly, the processing cost can be reduced and the deposition quality of the MTJ layer stack can be elevated.

Subsequently, a photoresist layer 188 is formed over the stack of mask layers 182, 184 and 186 to pattern the stack of mask layers 182, 184 and 186. An exemplary photolithography process may include photoresist coating (e.g., spin-on coating of the photoresist layer 188), soft baking, mask aligning (e.g., aligning a mask by adjusting the substrate and inspecting whether the recess 150R is aligned with a reference target), exposure, post-exposure baking, developing the photoresist layer 188, rinsing, drying (e.g., hard baking), other suitable processes, or combinations thereof.

In some embodiments, the stack of mask layers 182, 184 and 186 may be patterned to form a tri-layer photoresist or an etching mask (not shown) by the photoresist layer 188. The tri-layer photoresist includes the mask layer 186 as the top or uppermost portion, a middle mask layer 184, and a bottom mask layer 182. The mask layers 184 and 186 may include anti-reflective layers or backside anti-reflective layers to aid in the exposure and focus of the photoresist processing. The mask layer 182 may be a hard mask material, for example, a nitride.

Referring to FIG. 4L, the tri-layer photoresist is then used to pattern the underlying top electrode layer 178, the MTJ layer 176, the bottom electrode layer 174 and the dielectric layer 141'. In the cell region 100A, the top electrode layer 178, the MTJ layer 176 and the bottom electrode layer 174 are patterned to form a top electrode 138, a MTJ 136 and a bottom electrode 134, respectively. The top electrode layer 178, the MTJ layer 176 and the bottom electrode layer 174 are collectively referred to as a memory material layer. The memory material layer is extended in the trench 150H of the mark region 100C. The memory material layer is patterned according to the tri-layer photoresist (etching mask). The top electrode 138, the MTJ 136 and the bottom electrode 134 are collectively referred to as a memory element 130M. The top electrode 138, a MTJ 136, a bottom electrode 134 and the BEVA 132 may be collectively referred to as a memory cell 130. The dielectric layer 141' is etched during the pattering operation to form the dielectric layer 141 such that an upper surface of the dielectric layer 141 is lower than the bottom electrode 134. Subsequently, an etching operation is performed to remove the tri-layer photoresist.

In the mark region 100C, the top electrode layer 178, the MTJ layer 176 and the bottom electrode layer 174 are patterned to form mark layers 154, 156 and 158, respectively, of the alignment mark 150. The mark layers 154, 156 and 158 may be collectively referred to as a second mark layer. The dielectric layer 141' is etched during the patterning operation to form the dielectric layer 141 such that the upper surface of the dielectric layer 141 is level with the alignment mark 150. Through the patterning operation, the materials of the top electrode layer 178, the MTJ layer 176, and the bottom electrode layer 174 in the mark region 100C are removed. In some embodiments, after the patterning operation, the mark layers 152, 154, 156 and 158 fill up the trench 150H. In some embodiments, the top surfaces of the mark layers 152, 154, 156 and 158 are substantially coplanar to one another. In some embodiments, the etching operation proceeds further downwardly and removes a thickness of the dielectric layer 141' such that the remaining thickness of the dielectric layer 141 in the mark region 100C is less than that in the cell region 100A. In some embodiments, the etch removes the entire dielectric layer 141' and exposes the etch stop layer 146 or 144.

FIG. 4M shows a deposition step of a spacer layer 143' over the bottom electrode 134, the MTJ 136, the top electrode 138 and the dielectric layer 141 in the cell region 100A. The spacer layer 143' further covers a top surface of the dielectric layer 141 and the top surfaces of the mark layers 152, 154, 156 and 158. In some embodiments, a sidewall of the bottom electrode 134, a sidewall of the MTJ 136 and a sidewall of the top electrode 138 are surrounded by the spacer layer 143' to prevent oxidation or contamination in the subsequent operations.

Referring to FIG. 4N, the spacer layer 143' is patterned to form a spacer 143 and expose a top surface of the dielectric layer 141. In some embodiments, after the spacer 143 is formed, a protection layer 145 is formed over the spacer 143 and the dielectric layer 141 in the cell region 100A. The protection layer 145 is also formed over the dielectric layer 141 in the mark region 100C. In some embodiments, the protection layer 145 is formed in a conformal manner. Subsequently, a protection layer 147 is deposited over the protection layer 145, in both the cell region 100A and the mark region 100C. In some embodiments, the protection layers 145 and 147 comprise dielectric materials. In some embodiments, the protection layers 145 and 147 are chosen to have different materials. For example, in some embodiments, the protection layer 145 is formed of aluminum oxide. In some embodiments, the protection layer 147 includes atomic layer deposition (ALD) oxide and is formed by an ALD process.

The spacer 143, the protection layer 145 and the protection layer 147 are then etched back to remove horizontal portions of the protection layer 147 so as to expose the top surfaces of the top electrode 138 and the etch stop layer 146 in the cell region 100A. In some embodiments, portions of the spacer 143 along the sidewalk of the top electrode 138 are also removed so as to expose an upper portion of the sidewalls of the top electrode 138. The protection layer 145 and the protection layer 147 are then etched back to expose the top surface of the etch stop layer 146 in the cell region 100A and the mark region 100C.

A dielectric layer 142 is then deposited over the etch stop layer 146 after the top surface of the etch stop layer 146 is exposed. The dielectric layer 142 may be formed by initially depositing a dielectric material over the memory cell 130 and the alignment mark 150, followed by a planarization operation to form a planar upper surface of the dielectric layer 142 across the cell region 100A and the mark region 100C.

In the present disclosure, a memory device and a method for forming thereof are provided. The alignment marks are formed without an additional lithography process or additional cleaning process, thus reducing the processing costs and elevating the deposition quality of the MTJ layer stack.

In some embodiments, a method for manufacturing a semiconductor structure includes following operations. A substrate having a cell region and a mark region is received. A first dielectric layer is formed over the substrate. A conductive line is formed in the first dielectric layer in the cell region. A second dielectric layer is formed over the first dielectric layer. The second dielectric layer is etched to expose the conductive line in the cell region and form a trench in the mark region. A conductive layer is formed over the cell region and in the trench. The conductive layer is etched to form a bottom electrode via in the cell region and a first mark layer in the trench.

In some embodiments, a method for manufacturing a semiconductor structure includes following operations. A substrate having a cell region and a mark region is received. A first dielectric layer is formed over the substrate. A conductive line is formed in the first dielectric layer in the cell region. A second dielectric layer is formed over the first dielectric layer. In some embodiments, the second dielectric layer has a hole exposing the conductive line in the cell region and a trench extending through the second dielectric layer in the mark region. In some embodiments, the trench extends to a depth of the first dielectric layer. A conductive layer is deposited in the hole and the trench to form a bottom electrode via in the hole and a first mark layer in the trench.

In some embodiments, a semiconductor structure is provided. The semiconductor structure includes a substrate, a bottom electrode via, a memory element and an alignment mark. The substrate has a cell region and a mark region. The bottom electrode via is disposed in the cell region. The memory element is disposed over the bottom electrode via. The alignment mark is disposed in the mark region. In some embodiments, the alignment mark includes a first mark layer and a second mark layer over the first mark layer. In some embodiments, a material of the first mark layer is substantially same as a material of the bottom electrode via. In some embodiments, a material of the second mark layer is substantially same as a material of the memory element.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   receiving a substrate having a cell region and a mark region;
   forming a first dielectric layer over the substrate;
   depositing a first etch stop layer and a second etch stop layer in successively over the first dielectric layer, wherein the first etch stop layer and the second etch stop layer comprise different materials;
   forming a conductive line in the first dielectric layer in the cell region;
   forming a second dielectric layer over the second etch stop layer;
   etching the first dielectric layer, the first etch stop layer, the second etch stop layer and the second dielectric layer to expose the conductive line in the cell region and form a trench in the mark region;
   forming a conductive layer over the cell region and in the trench;
   forming a sacrificial layer over the cell region and the mark region;
   etching the conductive layer to form a bottom electrode via in the cell region and a first mark layer in the trench, wherein an upper surface of a bottom portion of the first mark layer is lower than a bottom surface of the first etch stop layer;
   removing an entirety of the sacrificial layer from the trench while leaving the first mark layer in the trench and exposing the first mark layer through the removal of the sacrificial layer;
   forming a memory element and a second mark layer in the cell region and the mark region, respectively;
   depositing a spacer layer over the memory element and the second mark layer;
   depositing a first material of a first protection layer laterally surrounding the spacer layer;
   depositing a second material of a second protection layer laterally surrounding the first material of the first protection layer, wherein the first protection layer and the second protection layer comprise different materials;
   patterning the spacer layer, the first material and the second material to form a spacer, the first protection layer and the second protection layer on the memory element while completely removing the spacer layer, the first material and the second material from the mark region; and
   depositing a third dielectric layer laterally surrounding the second protection layer and covering the first mark layer.

2. The method of claim 1, wherein the first protection layer is formed of aluminum oxide.

3. The method of claim 1, wherein after the removing of the entirety of the sacrificial layer from the trench while leaving the first mark layer in the trench, there is only the first mark layer left in the trench, wherein a bottom surface of the bottom electrode via is higher than the upper surface of the bottom portion the first mark layer.

4. The method of claim 1, wherein top surfaces of the first protection layer and the second protection layer are in contact with the third dielectric layer.

5. The method of claim 1, wherein lower portions of the first protection layer and the second protection layer laterally surround the bottom electrode via.

6. The method of claim 1, wherein the first etch stop layer and the second etch stop layer laterally surround the bottom electrode via.

7. The method of claim 1, wherein the first etch stop layer and the second etch stop layer are formed of SiCN and aluminum oxide, respectively.

8. The method of claim 1, wherein etching the conductive layer to form the first mark layer in the trench comprises leaving the first mark layer and a residual portion of the sacrificial layer in the trench prior to removing the entirety of the sacrificial layer from the trench.

9. The method of claim 8, wherein the trench is completely filled with the first mark layer and the residual portion of the sacrificial layer prior to removing the entirety of the sacrificial layer from the trench.

10. The method of claim 1, wherein the first mark layer has a uniform conductive material of the conductive layer.

11. A method for manufacturing a semiconductor structure, comprising:
    receiving a substrate having a cell region and a mark region;
    forming a first dielectric layer over the substrate;
    forming a conductive line in the first dielectric layer in the cell region;
    depositing a first etch stop layer and a second etch stop layer in successively over the first dielectric layer, wherein the first etch stop layer and the second etch stop layer comprise different materials;
    forming a second dielectric layer over the second etch stop layer, wherein the second dielectric layer has a hole exposing the conductive line in the cell region and a trench extending through the second dielectric layer, the first etch stop layer and the second etch stop layer in the mark region, wherein the trench extends to a depth of the first dielectric layer;

depositing a conductive layer in the hole and the trench;

depositing a sacrificial layer over the conductive layer, wherein the sacrificial layer completely fills the trench;

performing a planarization operation to thin the sacrificial layer and the conductive layer to thereby form a bottom electrode via in the hole and a first mark layer in the trench, wherein a top surface of an upper portion of the first mark layer is coplanar with an upper surface of the sacrificial layer in the trench, and an upper surface of a bottom portion of the first mark layer is lower than a bottom surface of the first etch stop layer;

completely removing the sacrificial layer from the trench while leaving the first mark layer in the trench and exposing the first mark layer through the removal of the sacrificial layer;

forming a memory element and a second mark layer in the cell region and the mark region, respectively;

depositing a spacer layer over the memory element and the second mark layer;

depositing a first material of a first protection layer laterally surrounding the spacer layer;

depositing a second material of a second protection layer laterally surrounding the first material of the first protection layer, wherein the first protection layer and the second protection layer comprise different materials;

patterning the spacer layer, the first material and the second material to form a spacer, the first protection layer and the second protection layer on the memory element while completely removing the spacer layer, the first material and the second material from the mark region; and depositing a third dielectric layer laterally surrounding the second protection layer and covering the first mark layer.

12. The method of claim 11, further comprising:
patterning a hard mask layer over the second dielectric layer;
patterning the second dielectric layer to form the hole and the trench using the hard mask layer as an etching mask; and
removing the hard mask layer after the forming of the hole and the trench.

13. The method of claim 11, further comprising forming a protection layer laterally surrounding the spacer in the cell region, wherein the protection layer includes a top surface level with a top surface of the spacer.

14. The method of claim 11, wherein the forming of the memory element comprises:
forming a memory material layer over the cell region and the mark region, the memory material layer extending in the trench;
forming a stack of mask layers over the memory material layer prior to patterning the memory material layer;
patterning the stack of mask layers to form an etching mask; and
patterning the memory material layer to form the memory element according to the etching mask.

15. The method of claim 11, wherein the third dielectric layer laterally surrounds a lower portion of the memory element, exposes a top portion of the memory element, and laterally surrounds the first mark layer and the second mark layer.

16. The method of claim 11, wherein a width of the trench is greater than a width of the hole.

17. A method for manufacturing a semiconductor structure, comprising:
receiving a substrate having a cell region and a mark region;
forming a first etch stop layer, a second etch stop layer and a first dielectric layer successively over the substrate, wherein the first etch stop layer and the second etch stop layer comprise different materials;
etching the first dielectric layer, the second etch stop layer and the first etch stop layer to form a hole and a trench in the cell region and the mark region, respectively;
depositing a conductive material in the hole and the trench;
depositing a sacrificial layer across the cell region and the mark region, wherein the sacrificial layer completely fills the trench;
performing a planarization operation to remove an entirety of the sacrificial layer from the cell region and leave a portion of the sacrificial layer and a portion of the conductive material in the trench of the mark region;
removing the portion of the sacrificial layer from the trench while leaving the conductive material in the trench and exposing the conductive material through the removal of the portion of the sacrificial layer, wherein an upper surface of a bottom portion of the portion of the conductive material in the trench is lower than a bottom surface of the first etch stop layer;
forming a memory element and a second mark layer in the cell region and the mark region, respectively;
depositing a spacer layer over the memory element and the second mark layer;
depositing a first material of a first protection layer laterally surrounding the spacer layer;
depositing a second material of a second protection layer laterally surrounding the first material of the first protection layer, wherein the first protection layer and the second protection layer comprise different materials;
patterning the spacer layer, the first material and the second material to form a spacer, the first protection layer and the second protection layer on the memory element while completely removing the spacer layer, the first material and the second material from the mark region; and
depositing a third dielectric layer laterally surrounding the second protection layer and covering the second mark layer.

18. The method of claim 17, wherein the planarization operation forms a first mark layer of an alignment mark in the mark region.

19. The method of claim 18, further comprising:
depositing a first memory material layer, a second memory material layer and a third memory material layer in sequence across the cell region and the mark region; and
patterning the first memory material layer, the second memory material layer and the third memory material layer to form a bottom electrode layer, a magnetic tunneling junction layer, and a top electrode layer, respectively, of the memory element in the cell region.

20. The method of claim 18, wherein the third dielectric layer laterally surrounds the spacer and a lower portion of the memory element, wherein the third dielectric layer covers and laterally surrounds the first mark layer and the second mark layer.

* * * * *